(12) United States Patent
Yorisue et al.

(10) Patent No.: US 11,809,079 B2
(45) Date of Patent: Nov. 7, 2023

(54) PHOTOSENSITIVE RESIN COMPOSITION, POLYIMIDE PRODUCTION METHOD, AND SEMICONDUCTOR DEVICE

(71) Applicant: ASAHI KASEI KABUSHIKI KAISHA, Tokyo (JP)

(72) Inventors: Tomohiro Yorisue, Tokyo (JP); Yoshito Ido, Tokyo (JP); Taihei Inoue, Tokyo (JP); Harumi Matsuda, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/744,873

(22) Filed: May 16, 2022

(65) Prior Publication Data
US 2022/0269170 A1     Aug. 25, 2022

Related U.S. Application Data
(62) Division of application No. 16/893,925, filed on Jun. 5, 2020, now abandoned, which is a division of
(Continued)

(30) Foreign Application Priority Data

Aug. 21, 2015  (JP) ................................. 2015-163555
Apr. 18, 2016  (JP) ................................. 2016-083042

(51) Int. Cl.
*G03F 7/038*  (2006.01)
*G03F 7/38*   (2006.01)
(Continued)

(52) U.S. Cl.
CPC ....... *G03F 7/0387* (2013.01); *C08G 73/1071* (2013.01); *C08L 79/08* (2013.01);
(Continued)

(58) Field of Classification Search
CPC .......... G03F 7/037; G03F 7/40; G03F 7/0387; G03F 7/0388; H01L 21/02118; C08L 79/08; C08G 73/1046
See application file for complete search history.

(56) References Cited

U.S. PATENT DOCUMENTS
5,374,469 A    12/1994   Hino et al.
5,578,697 A    11/1996   Kawamonzen et al.
(Continued)

FOREIGN PATENT DOCUMENTS
JP    2000-003910 A    1/2000
JP    2002-003602 A    1/2002
(Continued)

OTHER PUBLICATIONS
Yokota, Rikio. "Structures and Properties of Polyimide Molecular Blends and Copolymers formed from Poly (amic acid)" Recent Progress in Polyimides, 1992, pp. 56-62.*
(Continued)

*Primary Examiner* — John S Chu
(74) *Attorney, Agent, or Firm* — Greenblum & Bernstein, P.L.C.

(57) ABSTRACT

A semiconductor device having a copper wiring and an insulating layer provided on the copper wiring, where after storage in air with a humidity of 5% for 168 hours at 150° C., the area of void portion of the copper wiring is 10% or less at the copper wiring surface in contact with the insulating layer. The insulating layer contains at least one polyimide that has (i) a structure derived from 4,4'-oxydiphthalic acid dianhydride and a structure derived from 4,4'-diaminodiphenyl ether; or (ii) a structure derived from 3,3'4,4'-biphenyltetracarboxylic acid dianhydride and a structure derived from 4,4'-diaminodiphenyl ether; or (iii) a structure derived from 4,4'-oxydiphthalic acid dianhydride
(Continued)

and a structure derived from 2,2'-dimethyl-4,4'-diaminobiphenyl.

8 Claims, 1 Drawing Sheet

Related U.S. Application Data application No. 15/741,603, filed as application No. PCT/JP2016/074143 on Aug. 18, 2016, now Pat. No. 10,719,016.

(51) Int. Cl.
| | |
|---|---|
| *G03F 7/40* | (2006.01) |
| *H01L 21/02* | (2006.01) |
| *C08G 73/10* | (2006.01) |
| *G03F 7/031* | (2006.01) |
| *H01L 21/311* | (2006.01) |
| *C08L 79/08* | (2006.01) |
| *G03F 7/037* | (2006.01) |
| *H01L 23/532* | (2006.01) |
| *G03F 7/20* | (2006.01) |

(52) U.S. Cl.
CPC ............. *G03F 7/031* (2013.01); *G03F 7/037* (2013.01); *G03F 7/0382* (2013.01); *G03F 7/0388* (2013.01); *H01L 21/02118* (2013.01); *H01L 21/02282* (2013.01); *H01L 21/311* (2013.01); *H01L 23/5329* (2013.01); *H01L 23/53238* (2013.01); *G03F 7/2002* (2013.01); *G03F 7/38* (2013.01); *G03F 7/40* (2013.01)

(56) References Cited

U.S. PATENT DOCUMENTS

| | | | |
|---|---|---|---|
| 6,656,828 B1 | 12/2003 | Maitani et al. | |
| 8,673,537 B2 | 3/2014 | Furuya et al. | |
| 2001/0012596 A1 | 8/2001 | Kunimoto et al. | |
| 2006/0210819 A1* | 9/2006 | Dueber | C09J 7/35 |
| | | | 428/474.4 |
| 2011/0084787 A1* | 4/2011 | Fujii | H05K 1/056 |
| | | | 430/312 |
| 2011/0291260 A1 | 12/2011 | Honda et al. | |
| 2012/0012366 A1 | 1/2012 | Lee et al. | |
| 2013/0021543 A1 | 1/2013 | Lin et al. | |
| 2015/0111152 A1 | 4/2015 | Shin et al. | |
| 2015/0147567 A1* | 5/2015 | Simone | H05K 1/036 |
| | | | 428/458 |
| 2015/0337116 A1 | 11/2015 | Ono et al. | |
| 2015/0353685 A1 | 12/2015 | Enomoto et al. | |
| 2016/0332960 A1 | 11/2016 | Oh et al. | |
| 2017/0101521 A1 | 4/2017 | Koyama | |
| 2018/0031970 A1 | 2/2018 | Arimoto et al. | |
| 2018/0079864 A1 | 3/2018 | Kawabata et al. | |

FOREIGN PATENT DOCUMENTS

| | | |
|---|---|---|
| JP | 2003-345012 A | 12/2003 |
| JP | 2005-112904 A | 4/2005 |
| JP | 2013-151627 A | 8/2013 |
| JP | 2014-201695 A | 10/2014 |
| JP | 2015-108053 A | 6/2015 |
| JP | 2015-113429 A1 | 6/2015 |
| JP | 2015-147907 A | 8/2015 |
| TW | 201430058 A | 8/2014 |
| TW | 201431909 A | 8/2014 |
| TW | 201527875 A | 7/2015 |
| WO | 2000/44043 A1 | 7/2000 |
| WO | 2014/024951 A1 | 2/2014 |
| WO | 2015/118836 A1 | 8/2015 |
| WO | 2015/199219 A1 | 12/2015 |
| WO | 2016/140024 A1 | 9/2016 |
| WO | 2016/194769 A1 | 12/2016 |
| WO | 2017/033833 A1 | 3/2017 |

OTHER PUBLICATIONS

International Search Report for PCT/JP2016/074143, dated Sep. 13, 2016.
Written Opinion for PCT/JP2016/074143, dated Sep. 13, 2016.
International Preliminary Report on Patentability for PCT/JP2016/074143, dated Feb. 27, 2018.

\* cited by examiner

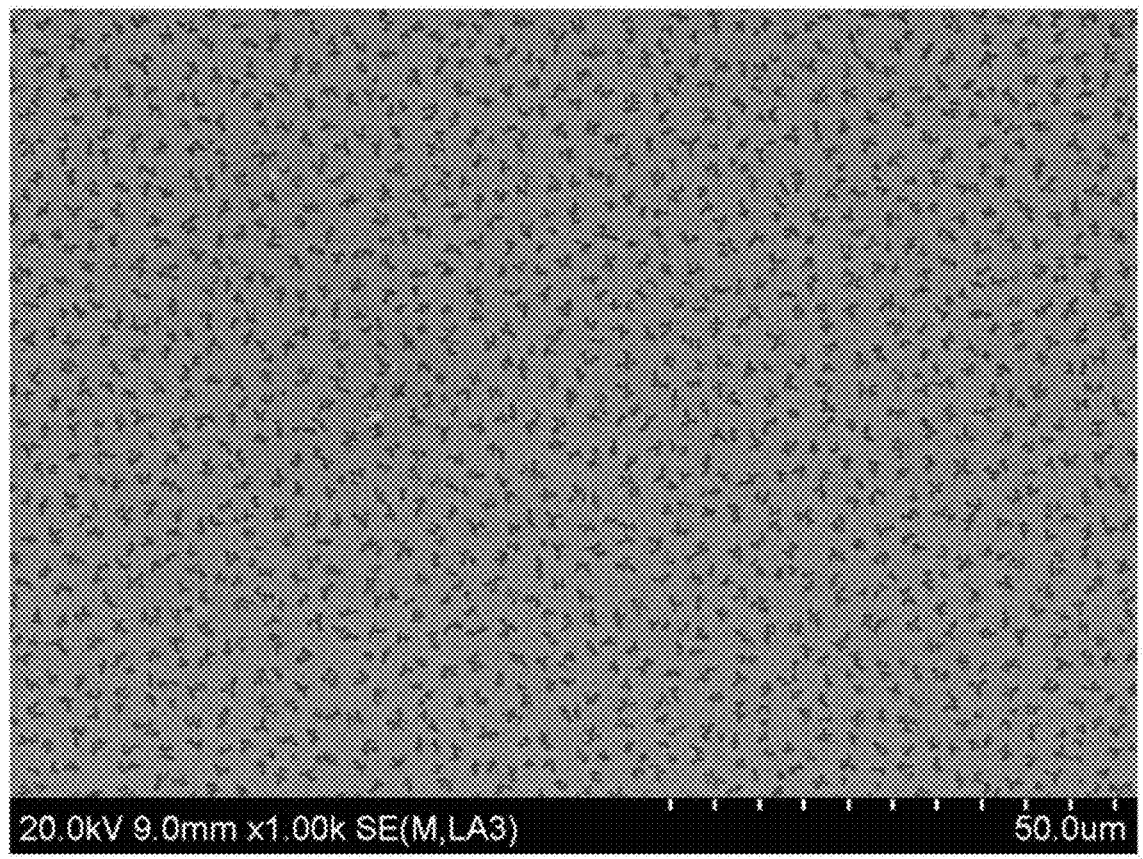

PHOTOSENSITIVE RESIN COMPOSITION, POLYIMIDE PRODUCTION METHOD, AND SEMICONDUCTOR DEVICE

This is a divisional of U.S. application Ser. No. 16/893,925, filed Jun. 5, 2020, which is a divisional of U.S. application Ser. No. 15/741,603, now U.S. Pat. No. 10,719,016, which is a U.S. national stage of PCT/JP2016/074143, filed Aug. 18, 2016, and claims priority to JP 2015-163555, filed Aug. 21, 2015, and to JP 2016-083042, filed Apr. 18, 2016. The disclosures of U.S. application Ser. Nos. 16/893,925 and 15/741,603, and PCT/JP2016/074143 are herein incorporated by reference in their entirety.

TECHNICAL FIELD

The present invention relates to a photosensitive resin composition for use in the relief pattern formation of, for example, an insulating material in an electronic component and of a passivation film, a buffer coat film, an interlayer insulating film, etc., in a semiconductor device, a production method of a polyimide using the same, and a semiconductor device.

BACKGROUND ART

Conventionally, a polyimide resin excellent in all of heat resistance, electric properties and mechanical properties is used for an insulating material of an electronic component and for a passivation film, a surface protective film, an interlayer insulating film, etc. in a semiconductor device. Among polyimide resins, those supplied in the form of a photosensitive polyimide precursor composition can easily form a heat-resistant relief-patterned coating film by applying the composition and subjecting the coating to exposure, development and thermal imidization treatment by curing. Such a photosensitive polyimide precursor composition is characterized by enabling a great reduction in processing time, compared with conventional non-photosensitive polyimide materials.

Meanwhile, a semiconductor device (hereinafter, sometimes referred to as "device") is mounted on a printed circuit board by various methods according to the purpose. A conventional device is generally manufactured by the wire bonding method of connecting an external terminal (pad) and a lead frame of the device by a thin wire. However, in these days, with the increase in operation speed of the device and the rise of operation frequency to GHz, the difference in the wiring length of respective terminals in mounting comes to affect the operation of the device. Accordingly, mounting of a device for high-end applications requires accurate control of the mounting/wiring length, but it is difficult to satisfy this requirement by wire bonding.

To satisfy the requirement, flip-chip mounting where after forming a rewiring layer on a surface of a semiconductor chip and forming a bump (electrode) thereon, the chip is turned over (flipped) and directly mounted on a printed circuit board, has been proposed (see, for example, Patent Document 1). In this flip-chip mounting, the wiring distance can be accurately controlled. Accordingly, the flip-chip mounting is employed in a device for high-end applications dealing with a high-speed signal or because of a small mounting size, employed in a cellular phone, etc., and demands thereof are rapidly expanding. In the case of using a polyimide material for flip-chip mounting, it passes through a step of forming a metal wiring layer after a pattern is formed in the polyimide layer. The metal wiring layer is usually formed as follows. First, the polyimide layer surface is plasma-etched to roughen the surface, and a metal layer working out to a plating seed layer is formed to a thickness of 1 μm or less by sputtering. Thereafter, electrolytic plating is performed using the metal layer as an electrode to form a metal wiring layer. At this time, in general, Ti is used as the metal working out to the seed layer, and Cu is used as the metal of a rewiring layer formed by electrolytic plating.

With respect to such a metal rewiring layer, the adhesion between the rewiring metal layer and the polyimide layer must be high after a reliability test. The reliability test as performed herein includes, for example, a high-temperature storage test of holding the layers in an air with a humidity of 51 for 168 hours under the condition of 150° C.

RELATED ART

Patent Document

Patent Document 1: Kokai (Japanese Unexamined Patent Publication) No. 2001-338947

SUMMARY OF THE INVENTION

Problems to be Solved by the Invention

However, when the above-described high-temperature storage test is performed using a conventional polyimide resin, a Cu component in the rewiring layer moves to the polyimide layer. As illustrated in FIG. 1, an empty void (hereinafter, sometimes referred to as void) is disadvantageously generated at the interface of the rewired Cu layer in contact with the polyimide layer. When a void is generated at the interface of the Cu layer and the polyimide layer, the adhesion of those two layers is reduced. If the Cu layer is separated from the polyimide layer, then short-circuiting or disconnection may occur in the rewiring layer.

The present invention has been devised taking into account these conventional circumstances. More specifically, an object of the present invention is to provide a photosensitive resin composition, ensuring that after a high-temperature storage test, a void is less likely to be generated at the interface of a Cu layer in contact with a polyimide layer and a high-adhesion polyimide layer is obtained; a polyimide using the photosensitive resin composition; and a semiconductor device in which after a high-temperature storage test, a void is less likely to be generated at the interface of a Cu layer in contact with a polyimide layer and short circuiting or disconnection following a high-temperature storage test is unlikely to occur.

Means to Solve the Problems

The present inventors have found that the above-described object is achieved by combining a photosensitive polyimide precursor with a specific compound. The present invention has been accomplished based on this finding. More specifically, the present invention is as follows.

[1]

A photosensitive resin composition including:

a component (A) as a photosensitive polyimide precursor, and a component (B) having a structure represented by the following formula (B1):

[Chem. 1]

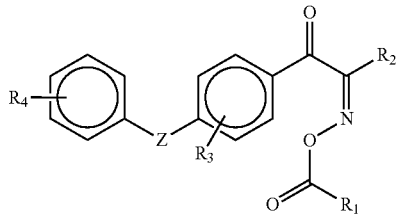

(B1)

(in formula (B1), Z is a sulfur or oxygen atom, and each of $R_1$ to $R_4$ independently represents a hydrogen atom or a monovalent organic group).

[2]

The photosensitive resin composition according to [1], wherein the component (A) is a photosensitive polyimide precursor containing a structure represented by the following formula (A1):

[Chem. 2]

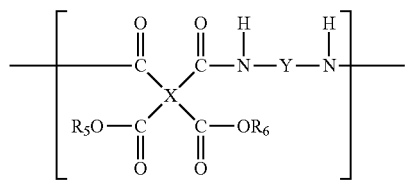

(A1)

{in formula (A1), X is a tetravalent organic group, Y is a divalent organic group, and each of $R_5$ and $R_6$ is independently a hydrogen atom, a monovalent organic group represented by the following formula (R1):

[Chem. 3]

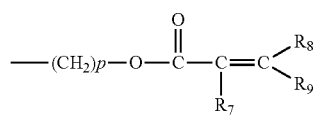

(R1)

(in formula ($R_1$), each of $R_7$, $R_8$ and $R_9$ is independently a hydrogen atom or a $C_1$-$C_3$ organic group, and p is an integer selected from the range of 2 to 10), or a $C_1$-$C_4$ saturated aliphatic group, provided that $R_5$ and $R_6$ are not both a hydrogen atom at the same time).

[3]

The photosensitive resin composition according to [1] or [2], wherein the component (B) is at least one member selected from the following formula (B2) to (B5):

[Chem. 4]

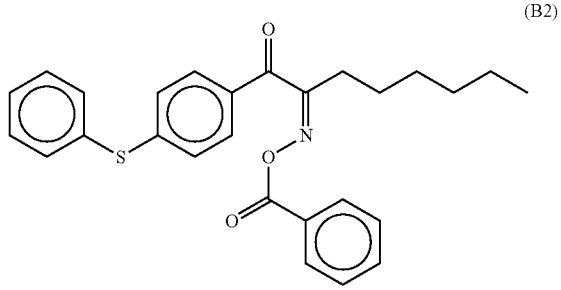

(B2)

[Chem. 5]

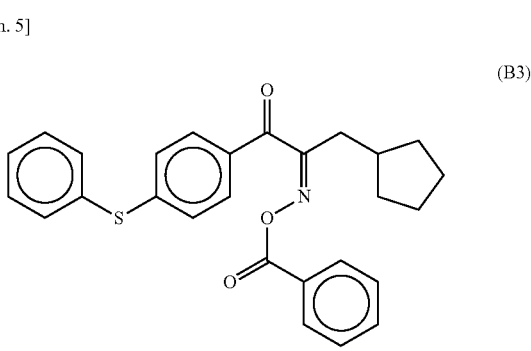

(B3)

[Chem. 6]

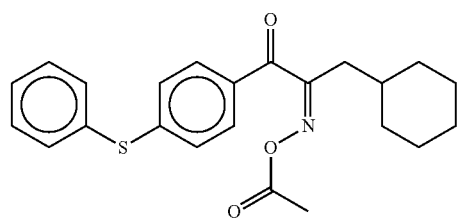

(B4)

[Chem. 7]

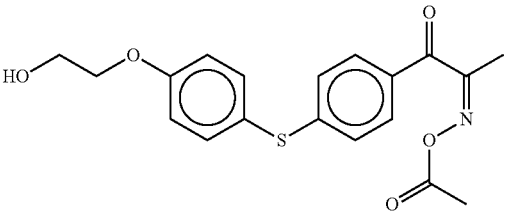

(B5)

[4]

The photosensitive resin composition according to [3], wherein the component (B) is at least one member selected from (B3) to (B5).

[5]

The photosensitive resin composition according to [4], wherein the component (B) is at least one member selected from (B3) and (B4).

[6]

The photosensitive resin composition according to any one of [2] to [5], wherein X in formula (A1) is at least one or more tetravalent organic groups selected from the following (C1) to (C3):

[Chem. 8]

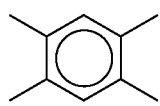
(C1)

[Chem. 9]

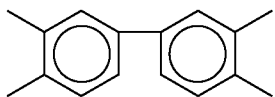
(C2)

[Chem. 10]

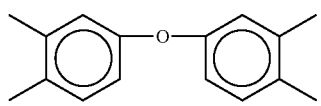
(C3)

[7]
The photosensitive resin composition according to any one of [3] to [6], wherein Y in formula (A1) is at least one or more divalent organic groups selected from the following (D1) to (D3):

[Chem. 11]

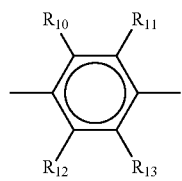
(D1)

(in formula (D1), $R_{10}$ to $R_{13}$ are a hydrogen atom or a $C_1$-$C_4$ monovalent aliphatic group and may be different from or the same as one another),

[Chem. 12]

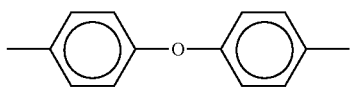
(D2)

[Chem. 13]

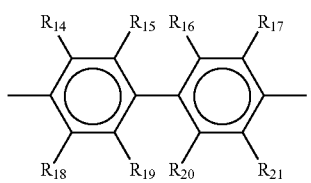
(D3)

(in formula (D3), $R_{14}$ to $R_{21}$ are a hydrogen atom, a halogen atom, or a $C_1$-$C_4$ monovalent organic group and may different from or the same as one another).
[8]
The photosensitive resin composition according to [7], wherein Y in formula (A1) is (D3).
[9]
The photosensitive resin composition according to any one of [3] to [7], wherein X in formula (A1) is the following (C3):

[Chem. 14]

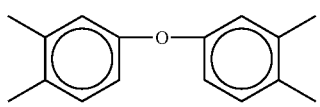
(C3)

and Y is the following (D2):

[Chem. 15]

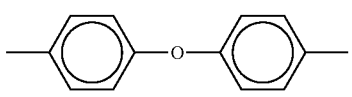
(D2)

[10]
The photosensitive resin composition according to any one of [3] to [7], wherein X in formula (A1) is the following (C2):

[Chem. 16]

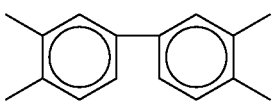
(C2)

and Y is the following (D2):

[Chem. 17]

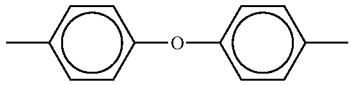
(D2)

[11]
The photosensitive resin composition according to any one of [1] to [10], wherein the content of the component (B) is from 0.1 to 10 parts by mass per 100 parts by mass of the component (A).
[12]
The photosensitive resin composition according to any one of [1] to [11], wherein the content of the component (B) is from 0.5 to 5 parts by mass per 100 parts by mass of the component (A).
[13]
The photosensitive resin composition according to any one of [1] to [12], wherein the component (A) is a polyamic acid derivative having a radical polymerizable substituent on the side chain.
[14]
A polyimide obtained by curing the photosensitive resin composition according to any one of [1] to [13].
[15]
A method for producing a polyimide, including:
a step of applying the photosensitive resin composition according to any one of [1] to [13] onto a substrate, and
a step of imidizing the photosensitive resin composition.
[16]
A semiconductor device including copper wiring and an insulating layer provided on the copper wiring, wherein:

after storage in air with a humidity of 5% for 168 hours under the condition of 150° C., the area of void portion of the copper wiring is 10 or less at the copper wiring surface in contact with the insulating layer.

[17]

The semiconductor device according to [16], wherein the area of void portion is 6, or less.

[18]

The semiconductor device according to [17], wherein the area of void portion is 5% or less.

[19]

The semiconductor device according to [18], wherein the area of void portion is 4% or less.

[20]

The semiconductor device according to [19], wherein the area of void portion is 3% or less.

[21]

The semiconductor device according to [20], wherein the area of void portion is 2% or less.

[22]

The semiconductor device according to [21], wherein the area of void portion is 1% or less.

[23]

The semiconductor device according to any one of [16] to [22], wherein the insulating layer contains a polyimide.

[24]

The semiconductor device according to any one of [16] to [23], wherein the insulating layer contains the polyimide according to [14].

Effects of the Invention

According to the present invention, a photosensitive resin composition, ensuring that after a high-temperature storage test, a void is less likely to be generated at the interface of a Cu layer in contact with a polyimide layer and a high-adhesion polyimide layer is obtained, and a polyimide using the photosensitive resin composition, can be provided. Furthermore, according to the present invention, a semiconductor device in which after a high-temperature storage test, a void is less likely to be generated at the interface of a Cu layer in contact with a polyimide layer and short circuiting or disconnection following a high-temperature storage test is unlikely to occur.

BRIEF DESCRIPTION OF THE DRAWINGS

FIG. 1 A diagram illustrating how an empty void (void) is generated at the interface of a rewired Cu layer and a polyimide layer.

MODE FOR CARRYING OUT THE INVENTION

The present invention is described specifically below. Throughout the present description, when a plurality of structures denoted by the same symbol in the formula are present in the molecule, the structures may be the same as or different from one another.

<Photosensitive Resin Composition>

The photosensitive resin composition of the present invention is characterized by including a component (A) as a photosensitive polyimide precursor, and a component (B) containing a structure represented by the following formula (B1):

[Chem. 18]

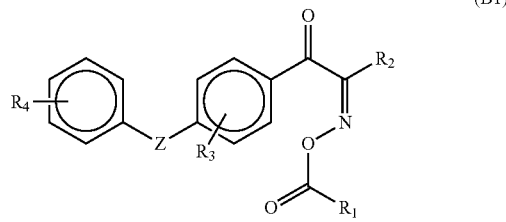

(B1)

(in formula (B1), Z is a sulfur or oxygen atom, and each of $R_1$ to $R_4$ independently represents a hydrogen atom or a monovalent organic group).

[(A) Photosensitive Polyimide Precursor]

The photosensitive polyimide precursor as the component (A) for use in the present invention is described.

The photosensitive polyimide precursor preferably used in the present invention has an i-line absorbance of 0.8 to 2.0. The i-line absorbance is measured on a 10 μm-thick film obtained after a solution of the photosensitive imide precursor alone is applied and prebaked.

In order for the side surface of an opening in a cured relief pattern obtained from the photosensitive resin composition to be of a forward tapered type, the photosensitive resin composition of the present invention preferably contains (A) a photosensitive polyimide precursor satisfying the above-described requirement.

<Method for Determining i-Line Absorbance>

After (A) a photosensitive polyimide precursor is pre-baked by itself, the i-line absorbance of a 10 μm-thick film can be measured on the coating film formed on quartz glass by means of a normal spectrophotometer. In the case where the thickness of the film formed is not 10 μm, the absorbance obtained on the film is converted to a 10 μm thickness according to Lambert-Beer law, and the i-line absorbance of 10 μm thickness can thereby determined.

If the i-line absorbance is less than 0.8, the structure of the photosensitive polyimide precursor (A) satisfying the absorbance is limited, and mechanical properties, thermophysical properties, etc. are inferior. If the i-line absorbance exceeds 2.0, light does not reach the bottom due to too large i-line absorption of the coating film and therefore, for example, in the case of a negative pattern, there may arise a problem that the bottom of the coating film is not cured.

The photosensitive polyimide precursor (A) of the present invention is preferably a polyimide precursor in which the main component is, for example, at least one resin selected from a polyamic acid, a polyamic acid ester, a polyamic acid salt, and a polyamic acid amide. The main component as used herein means to contain 60 mass % or more of such a resin relative to all resins, and it is preferable to contain 80 mass, or more of the resin. The photosensitive polyimide precursor (A) may contain another resin, if desired.

In view of heat resistance and mechanical properties of the film obtained after heat treatment, the weight average molecular weight (Mw) of the photosensitive polyimide precursor (A) is, in terms of polystyrene by gel permeation chromatography (GPC), preferably 1,000 or more, more preferably 5,000 or more. The upper limit of the weight average molecular weight (Mw) is preferably 100,000 or less. In view of solubility in a developer, the upper limit of the weight average molecular weight (Mw) is more preferably 50,000 or less.

In the photosensitive resin composition of the present invention, in view of heat resistance and photosensitivity, one of most preferable photosensitive polyimide precursors (A) is an ester-type photosensitive polyimide precursor containing a structure represented by the following formula (A1):

[Chem. 19]

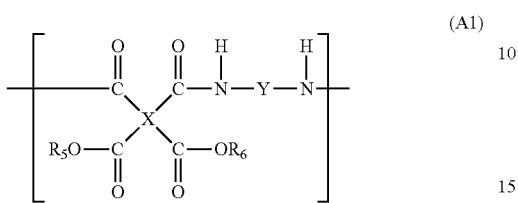

(A1)

(in formula (A1), X is a tetravalent organic group, Y is a divalent organic group, and each of $R_5$ and $R_6$ is independently a hydrogen atom, a monovalent organic group represented by the following formula (R1):

[Chem. 20]

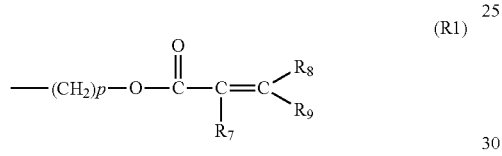

(R1)

(in formula (R1), each of $R_7$, $R_8$ and $R_9$ is independently a hydrogen atom or a $C_1$-$C_3$ organic group, and p is an integer selected from the range of 2 to 10), or a $C_1$-$C_4$ saturated aliphatic group, provided that $R_5$ and $R_6$ are not both a hydrogen atom at the same time).

In formula (A1), from the viewpoint of satisfying both heat resistance and photosensitive properties, the tetravalent organic group represented by X is preferably an organic group having a carbon number of 6 to 40, more preferably an aromatic or alicyclic group where a —COOR group, a —COOR$_2$ group and a —CONH— group are in ortho-positon to each other. The tetravalent organic group represented by X is preferably an organic group containing an aromatic ring and having a carbon number of 6 to 40, more preferably a structure represented by the following formula (30):

[Chem. 21]

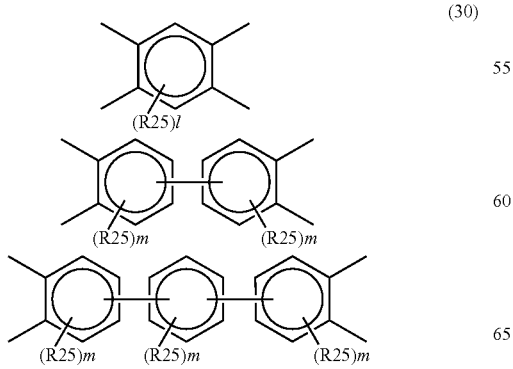

(30)

-continued

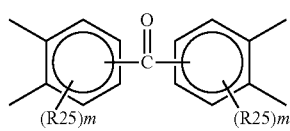
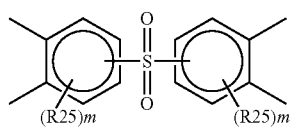
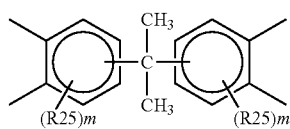
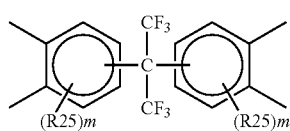
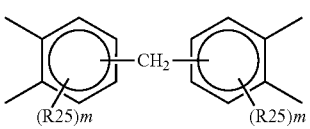
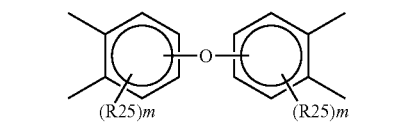
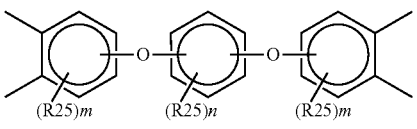
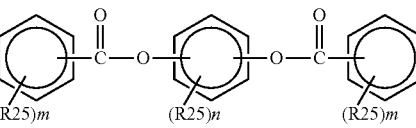
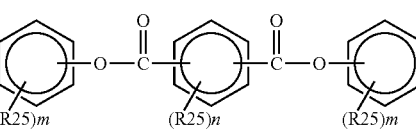
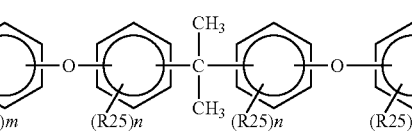
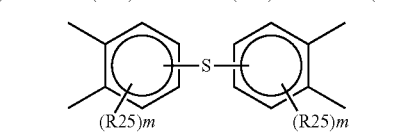
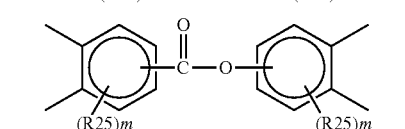
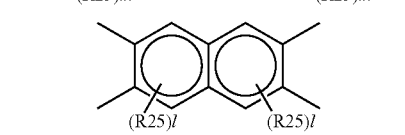

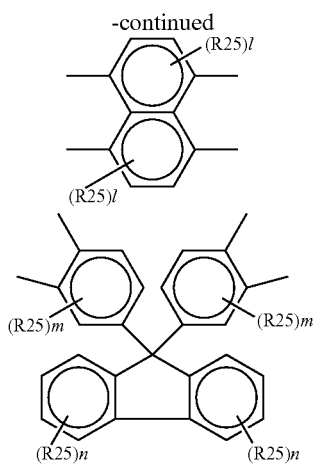

{in the formulae, R25 is a monovalent group selected from a hydrogen atom, a fluorine atom, a $C_1$-$C_{10}$ hydrocarbon group, and a $C_1$-$C_{10}$ fluorine-containing hydrocarbon group, l is an integer selected from the range of 0 to 2, m is an integer selected from the range of 0 to 3, and n is an integer selected from the range of 0 to 4}, but the present invention is not limited thereto. In addition, the structure of X may be one structure or a combination of two or more. The X group having a structure represented by the formula above is particularly preferred from the viewpoint of satisfying both heat resistance and photosensitive properties.

Among tetravalent organic groups represented by X in formula (A1), more preferable examples include at least one or more organic groups selected from the following (C1) to (C3):

[Chem. 22]

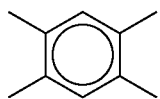

(C1)

[Chem. 23]

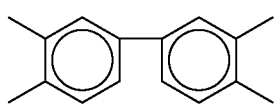

(C2)

[Chem. 24]

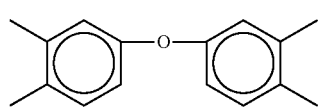

(C3)

These organic groups are particularly preferred from the viewpoint of suppressing generation of a void, but the present invention is not limited thereto. In addition, the structure of X may be one structure or a combination of two or more.

In formula (A1), from the viewpoint of satisfying both heat resistance and photosensitive properties, the divalent organic group represented by Y is preferably an aromatic group having a carbon number of 6 to 40 and includes, for example, a structure represented by the following formula (31):

[Chem. 25]

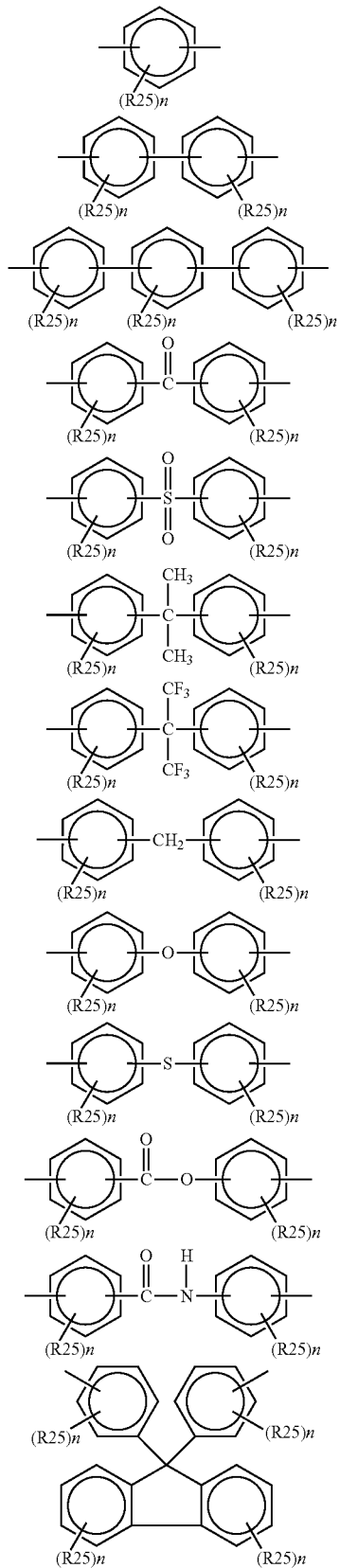

(31)

-continued

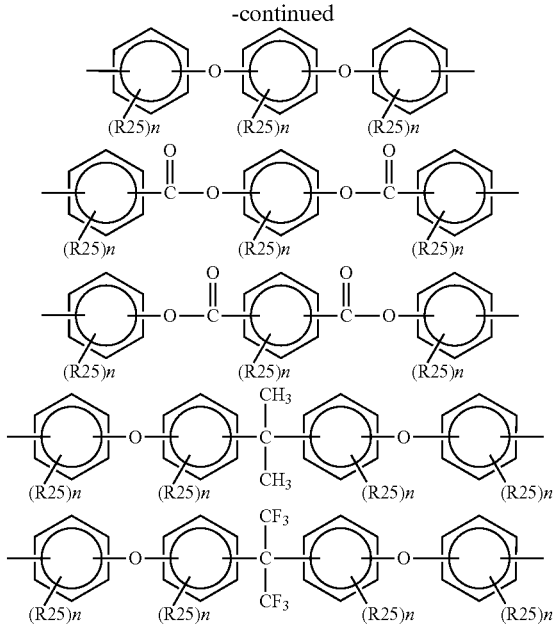

{in the formulae, R25 is a monovalent group selected from a hydrogen atom, a fluorine atom, a $C_1$-$C_{10}$ hydrocarbon group, and a $C_1$-$C_{10}$ fluorine-containing hydrocarbon group, and n is an integer selected from the range of 0 to 4}, but the present invention is not limited thereto. In addition, the structure of Y may be one structure or a combination of two or more. The Y group having a structure represented by formula (31) is particularly preferred from the viewpoint of satisfying both heat resistance and photosensitive properties.

With respect to $R_5$ and $R_6$ in formula (A1), $R_7$ in formula (R1) is preferably a hydrogen atom or a methyl group. In view of photosensitive properties, $R_8$ and $R_9$ are preferably a hydrogen atom. Furthermore, in view of photosensitive properties, p is preferably an integer of 2 to 10, more preferably an integer of 2 to 4.

Among divalent organic groups represented by $Y_1$ in formula (A1), more preferable examples include at least one or more divalent organic groups selected from the following (D1) to (D3):

[Chem. 26]

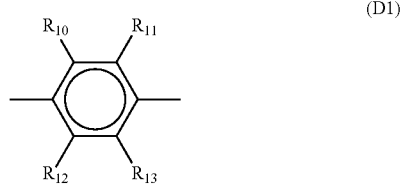

(in formula (D1), $R_{10}$ to $R_{13}$ are a hydrogen atom or a C1-C4 monovalent aliphatic group and may be different from or the same as one another),

[Chem. 27]

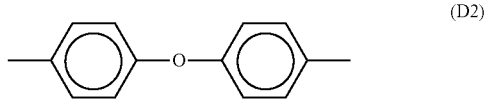

-continued
[Chem. 28]

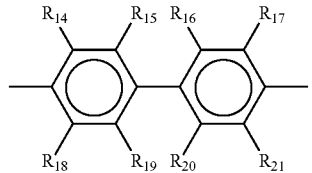

(in formula (D3), $R_{14}$ to $R_{21}$ are a hydrogen atom, a halogen atom, or a $C_1$-$C_4$ monovalent organic group and may different from or the same as one another). These organic groups are particularly preferred from the viewpoint of suppressing generation of a void, but the present invention is not limited thereto. Among others, Y in formula (A1) preferably contains (D3).

In the photosensitive resin composition of the present invention, in order to more reliably suppress generation of a void, it is particularly preferred that X in formula (A1) contains the following (C3):

[Chem. 29]

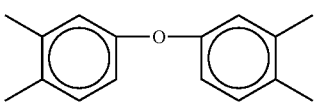

and Y contains the following (D2):

[Chem. 30]

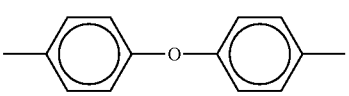

Furthermore, in the photosensitive resin composition of the present invention, in order to more reliably suppress generation of a void, it is particularly preferred that X in formula (A1) contains the following (C2):

[Chem. 31]

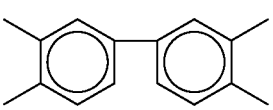

and Y contains the following (D2):

[Chem. 32]

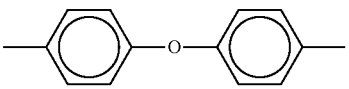

In the case of using a polyimide precursor as the resin (A), the system for imparting photosensitivity to the photosensitive resin composition includes an ester bonding type and an ion boning type. The former is a method of introducing a photopolymerizable group, i.e., an olefinic double bond-containing compound, into the side chain of the polyimide precursor by ester bonding. The latter is a method of bonding a carboxyl group of the polyimide precursor and an amino group of an amino group-containing (meth)acrylic compound via ion bonding, thereby imparting a photopolymerizable group.

The ester bonding-type polyimide precursor is obtained as follows. That is, a tetracarboxylic acid dianhydride containing the above-described tetravalent organic group X, alcohols having a photopolymerizable unsaturated double bond, and optionally, saturated aliphatic alcohols having a carbon number of 1 to 4 are reacted to prepare a partially esterified tetracarboxylic acid (hereinafter, sometimes referred to as an acid/ester form). The acid/ester form is then subjected to amide-polycondensation with diamines containing the divalent organic group Y to obtain the polyimide precursor.

(Preparation of Acid/Ester Form)

In the present invention, the tetracarboxylic acid dianhydride containing the tetravalent organic group X, which is suitably used for the preparation of the ester bonding-type polyimide precursor, includes, in addition to the acid dianhydride having a structure represented by formula (30), for example, pyromellitic anhydride, diphenyl ether-3,3',4,4'-tetracarboxylic acid dianhydride, benzophenone-3,3',4,4'-tetracarboxylic acid dianhydride, biphenyl-3,3',4,4'-tetracarboxylic acid dianhydride, diphenylsulfone-3,3',4,4'-tetracarboxylic acid dianhydride, diphenylmethane-3,3',4,4'-tetracarboxylic acid dianhydride, 2,2-bis(3,4-phthalic anhydride)propane, and 2,2-bis(3,4-phthalic anhydride)-1,1,1,3,3,3-hexafluoropropane. Pyromellitic anhydride, diphenyl ether-3,3',4,4'-tetracarboxylic acid dianhydride, biphenyl-3,3',4,4'-tetracarboxylic acid dianhydride, etc. are preferred. Pyromellitic anhydride, diphenyl ether-3,3',4,4'-tetracarboxylic acid dianhydride, benzophenone-3,3',4,4'-tetracarboxylic acid dianhydride, biphenyl-3,3',4,4'-tetracarboxylic acid dianhydride, etc. are preferred. Pyromellitic anhydride, diphenyl ether-3,3',4,4'-tetracarboxylic acid dianhydride, biphenyl-3,3',4,4'-tetracarboxylic acid dianhydride, etc. are more preferred, but the present invention is not limited thereto. One of these may be used alone, or two or more thereof may be mixed and used.

In the present invention, the alcohols having a photopolymerizable group, which are suitably used for the preparation of the ester bonding-type polyimide precursor, include, for example, 2-acryloyloxyethyl alcohol, 1-acryloyloxy-3-propyl alcohol, 2-acrylamidoethyl alcohol, methylol vinyl ketone, 2-hydroxyethyl vinyl ketone, 2-hydroxy-3-methoxypropyl acrylate, 2-hydroxy-3-butoxypropyl acrylate, 2-hydroxy-3-phenoxypropyl acrylate, 2-hydroxy-3-butoxypropyl acrylate, 2-hydroxy-3-tert-butoxypropyl acrylate, 2-hydroxy-3-cyclohexyloxypropyl acrylate, 2-methacryloyloxyethyl alcohol, 1-methacryloyloxy-3-propyl alcohol, 2-methacrylamidoethyl alcohol, 2-hydroxy-3-methoxypropyl methacrylate, 2-hydroxy-3-butoxypropyl methacrylate, 2-hydroxy-3-phenoxypropyl methacrylate, 2-hydroxy-3-butoxypropyl methacrylate, 2-hydroxy-3-tert-butoxypropyl methacrylate, and 2-hydroxy-3-cyclohexyloxypropyl methacrylate.

As the saturated aliphatic alcohols that can be optionally used together with alcohols having a photopolymerizable group, a saturated aliphatic alcohol having a carbon number of 1 to 4 is preferred. Specific examples thereof include methanol, ethanol, n-propanol, isopropanol, n-butanol, and tert-butanol.

The above-described tetracarboxylic acid dianhydride and alcohols, which are suitably used in the present invention, are mixed by stirring at a temperature of 20 to 50° C. for 4 to 10 hours preferably in an appropriate reaction solvent preferably in the presence of a basic catalyst such as pyridine. Consequently, an esterification reaction of the acid anhydride proceeds, and the desired acid/ester form can be obtained.

The reaction solvent is preferably a solvent capable of completely dissolving tetracarboxylic acid dianhydride, alcohols, which are raw materials, and an acid/ester form that is a product, more preferably a solvent capable of completely dissolving also a photosensitive polyimide precursor that is an amid-polycondensation product of the acid/ester form and diamine. Such a solvent includes, for example, N-methyl-2-pyrrolidone, N,N-dimethylacetamide, N,N-dimethylformamide, dimethyl sulfoxide, tetramethylurea, ketones, esters, lactones, ethers, halogenated hydrocarbons, and hydrocarbons.

As for specific examples thereof, ketones include, for example, acetone, methyl ethyl ketone, methyl isobutyl ketone, and cyclohexanone;

esters include, for example, methyl acetate, ethyl acetate, butyl acetate, and diethyl oxalate;

lactones include, for example, γ-butyrolactone;

ethers include, for example, ethylene glycol dimethyl ether, diethylene glycol dimethyl ether, and tetrahydrofuran;

halogenated hydrocarbons include, for example, dichloromethane, 1,2-dichloroethane, 1,4-dichlorobutane, chlorobenzene, and o-dichlorobenzene; and hydrocarbons include, for example, hexane, heptane, benzene, toluene, and xylene. If desired, one of these may be used alone, or two or more thereof may be mixed and used.

(Preparation of Photosensitive Polyimide Precursor)

A dehydration condensing agent is added to and mixed with the acid/ester form (typically in a solution state of being dissolved in the reaction solvent) preferably under cooling with ice, and the acid/ester form is thereby converted to a polyacid anhydride. Thereto, a solution or dispersion prepared by separately dissolving or dispersing diamines having the divalent organic group Y, which are suitably used in the present invention, in a solvent is added dropwise. Both are subjected to amide-polycondensation, and the desired photosensitive polyimide precursor can thereby be obtained. Together with diamines having the divalent organic group Y, diaminosiloxanes may be used in combination.

The dehydration condensing agent includes, for example, dicyclohexylcarbodiimide, 1-ethoxycarbonyl-2-ethoxy-1,2-dihydroquinoline, 1,1-carbonyldioxy-di-1,2,3-benzotriazole, and N,N'-disuccinimidyl carbonate.

In this way, a polyacid anhydride as an intermediate is obtained.

In the present invention, the diamines having a divalent organic group Y, which are suitably used for the reaction with the polyacid anhydride obtained above, include, in addition to a diamine having a structure represented by formula (31), for example, p-phenylenediamine, m-phenylenediamine, 4,4'-diaminodiphenyl ether, 3,4'-diaminodiphenyl ether, 3,3'-diaminodiphenyl ether, 4,4'-diaminodiphenyl sulfide, 3,4'-diaminodiphenyl sulfide, 3,3'-diaminodiphenyl sulfide, 4,4'-diaminodiphenylsulfone, 3,4'-diaminodiphenylsulfone, 3,3'-diaminodiphenylsulfone, 4,4'-diaminobiphenyl, 3,4'-diaminobiphenyl, 3,3'-diaminobiphenyl, 4,4'-diaminobenzophenone, 3,4'-diaminobenzophenone, 3,3'-diaminobenzophenone, 4,4'- diaminodiphenylmethane, 3,4'-diaminodiphenylmethane, 3,3'-diaminodiphenylmethane, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 4,4-bis(4-aminophenoxy)biphenyl, 4,4-bis(3-aminophenoxy)biphenyl, bis[4-(4-aminophenoxy)phenyl]ether, bis[4-(3-aminophenoxy)phenyl]ether, 1,4-bis(4-aminophenyl)benzene, 1,3-bis(4-aminophenyl)benzene, 9,10-bis(4-aminophenyl)anthracene, 2,2-bis(4-aminophenyl)propane, 2,2-bis(4-aminophenyl)hexafluoropropane, 2,2-bis[4-(4-aminophenoxy)phenyl]propane, 2,2-bis[4-(4-aminophenoxy)phenyl]hexafluoropropane, 1,4-bis(3-aminopropyldimethylsilyl)benzene, ortho-tolidinesulfone, 9,9-bis(4-aminophenyl)fluorene;

the diamines above in which part of hydrogen atoms on the benzene ring are substituted by a methyl group, an ethyl group, a hydroxymethyl group, a hydroxyethyl group, a halogen atom, etc.; and a mixture thereof.

Specific examples of the substitution product above include 3,3'-dimethyl-4,4'-diaminobiphenyl, 2,2'-dimethyl-4,4'-diaminobiphenyl, 3,3'-dimethyl-4,4'-diaminodiphenylmethane, 2,2'-dimethyl-4,4'-diaminodiphenylmethane, 3,3'-dimethoxy-4,4'-diaminobiphenyl, 3,3'-dichloro-4,4'-diaminobiphenyl, 2,2'-bis(trifluoromethyl)-4,4'-diaminobiphenyl, 2,2'-bis(fluoro)-4,4'-diaminobiphenyl, 4,4'-diaminooctafluorobiphenyl; and a mixture thereof. Among these, p-phenylenediamine, 4,4'-diaminodiphenyl ether, 2,2'-dimethyl-4,4'-diaminobiphenyl, 2,2'-bis(trifluoromethyl)-4,4'-diaminobiphenyl, 2,2'-bis(fluoro)-4,4'-diaminobiphenyl, 4,4'-diaminooctafluorobiphenyl, etc. are preferably used, and, for example, p-phenylenediamine, 4,4'-diaminodiphenyl ether, etc., and a mixture thereof are more preferred. The diamines are not limited to those recited as examples above.

Diaminosiloxanes are used in combination with diamines containing the divalent organic group Y at the time of preparation of the photosensitive polyimide precursor (A) for the purpose of enhancing adhesion between the coating film formed from the photosensitive resin composition of the present invention and various substrates. Specific examples of the diaminosiloxanes include, for example, 1,3-bis(3-aminopropyl) tetramethyldisiloxane and 1,3-bis(3-aminopropyl) tetraphenyldisiloxane.

After the completion of amide-polycondensation reaction, a water absorbing byproduct of the dehydration condensing agent coexisting in the reaction solution is removed by filtration, if desired. Subsequently, an appropriate poor solvent (for example, water, an aliphatic lower alcohol or a mixture thereof) is added to the solution containing the polymer component, and the polymer component is thereby precipitated. Furthermore, the polymer is purified, if desired, by repeating an operation such as re-dissolution or reprecipitation and then vacuum-dried to isolate the target photosensitive polyimide precursor. In order to improve the purification degree, ionic impurities may be removed by passing the polymer solution through a column filled with an anion and/or cation exchange resin swelled with an appropriate organic solvent.

In view of heat resistance and mechanical properties of the film obtained after heat treatment, the weight average molecular weight (Mw) of the ester bonding-type polyimide precursor is, in terms of polystyrene by gel permeation chromatography (GPC), preferably 1,000 or more, more preferably 5,000 or more. The upper limit of the weight average molecular weight (Mw) is preferably 100,000 or less. In view of solubility in a developer, the upper limit of the weight average molecular weight (Mw) is more preferably 50,000 or less. As the developing solvent of the gel permeation chromatography, tetrahydrofuran or N-methyl-2-pyrrolidone is recommended. The molecular weight is determined from a calibration curve prepared using a standard monodisperse polystyrene. As the standard monodisperse polystyrene, it is recommended to select an organic solvent-based standard sample, STANDARD SM-105, produced by Showa Denko K.K.

With respect to the photosensitive polyimide precursor (A) synthesized by such a method, the i-line absorbance of a film formed of the precursor alone, after prebaking, takes various values according to the molecular structure. However, the i-line absorbance of a mixture is an arithmetic average of i-line absorbances of respective components. Accordingly, the i-line absorbance of a 10 μm-thick film after prebaking of the photosensitive polyimide precursor (A) can be adjusted to the range of 0.8 to 2.0 by combining two or more photosensitive polyimide precursors (A) in an appropriate ratio in balancing the physical properties, and thermophysical properties, etc.

[Component (B)]

The component (B) for use in the present invention is described below.

The component (B) in the present invention is an oxime ester where the i-line absorbance of a 0.001 wt % solution is 0.02 or more and 0.5 or less, preferably 0.25 or less, more preferably 0.15 or less, and both the g-line absorbance and the h-line absorbance are 0.02 or less. Such an oxime ester has photosensitivity and is essential for patterning of the photosensitive resin by photolithography.

From the viewpoint of suppressing generation of a void in Cu after a high-temperature storage test, the i-line absorbance is preferably 0.5 or less. Both the g-line absorbance and the h-line absorbance are preferably 0.02 or less. In view of sensitivity in photolithography, the i-line absorbance is preferably 0.02 or more.

The component (B) that can be used in the present invention contains a structure represented by the following formula (B1):

[Chem. 33]

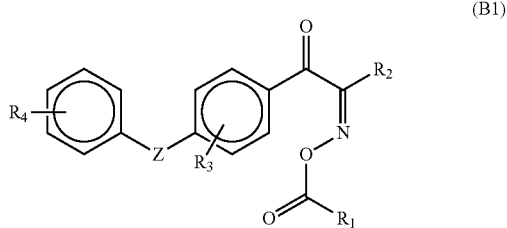

(B1)

(in formula (B1), Z is a sulfur or oxygen atom, and each of $R_1$ to $R_4$ independently represents a hydrogen atom or a monovalent organic group).

Each of the substituents used for $R_1$ to $R_4$ is independently preferably a hydrogen atom or a group selected from a linear, branched or cyclic alkyl group having a carbon number of 1 to 20, an alkylaryl group, an arylalkyl group and a hydroxyalkyloxy group. Specifically, the substituent includes a hydrogen atom, a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, an n-hexyl group, an isohexyl group, an n-octyl group, an isooctyl group, an n-decyl group, an isodecyl group, a cyclopropyl group, a cyclobutyl group, a cyclopentyl group, a cyclohexyl group, a methylcyclopentyl group, a cyclopentylmethyl group, a methylcyclohexyl group, a cyclohexylmethyl group, a phenyl group, a tolyl group, a xylyl group, a benzyl group, a hydroxyethyloxy group, a hydroxypropyloxy group, etc.

The component (B) that is preferably used contains at least one member selected from the following formulae (B2) to (B5):

[Chem. 34]

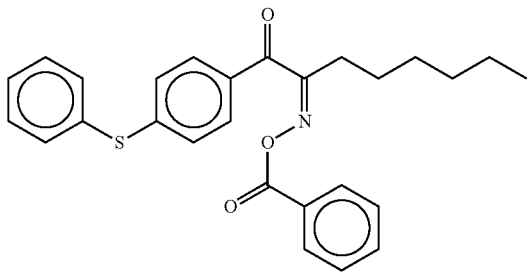

(B2)

[Chem. 35]

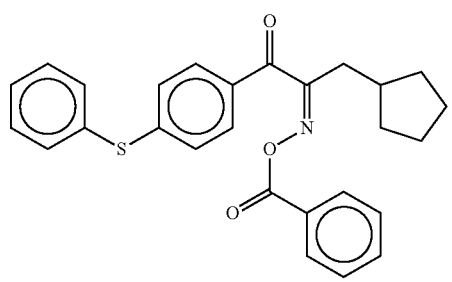

(B3)

(B4)

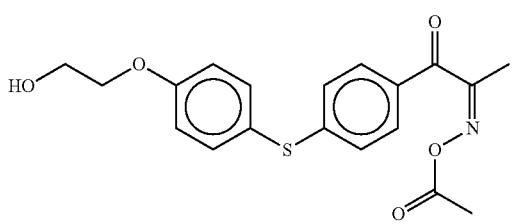

(B5)

The trade name of the component (B) that is preferably used includes, for example, Irgacure OXE-01 produced by BASF, TR-PBG-305 and TR-PBG-3057 both produced by Changzhou Tronly New Electronic Materials Co., Ltd., and NCI-930 produced by ADEKA Corporation.

The component (B) is used in an addition amount of 0.1 to 10 parts by mass, preferably from 0.5 to 5 parts by mass, per 100 parts by mass of the component (A). If the amount added of the component (B) is less than 0.1 parts by mass per 100 parts by mass of the component (A), the effect of suppressing generation of a void at the interface of the Cu layer and the polyimide layer after a high-temperature storage test is insufficient. If the amount added of the component (B) exceeds 10 parts by mass per 100 parts by mass of the component (A), the filterability or application property of the composition deteriorates.

The oxime ester preferably used in the present invention is characterized in that when the g-line, h-line and i-line absorbances of a 0.001 wt % solution are viewed, the i-line transmittance is from 0.02 to 0.15 in all cases and the compound has almost no absorption in the g-line and h-line regions. In the oxime ester used as a photopolymerization initiator, the i-line absorbance is usually higher than that in the present invention, and some have absorption in the g-line and h-line regions. On the other hand, some the oxime esters have almost no absorption in all of the g-line, h-line and i-line regions and must be used in combination with a sensitizer.

As seen in such characteristics of g-line, h-line and i-line absorption spectra, the oxime ester of the present invention generates, at the time of exposure, not only a photopolymerization initiation radical but also a specific amount of a specific amine. The specific amine is considered to undergo a specific interaction with Cu and the migration of Cu at the time of a high-temperature storage test is thereby inhibited.

[(C) Other Components]

The photosensitive resin composition of the present invention may further contain a component other than the component (A) and the component (B).

The photosensitive resin composition of the present invention is used typically as a liquid photosensitive resin composition by dissolving respective components above and an optional component further used as needed in a solvent to make a varnish. Accordingly, other components (C) include a solvent. In addition, other components (C) include, for example, a resin except for the photosensitive polyimide precursor of the component (A), a sensitizer, a monomer having a photopolymerizable unsaturated bond, an adhesion aid, a thermal polymerization inhibitor, an azole compound, and a hindered phenol compound.

The solvent includes, for example, a polar solvent and alcohols.

As the solvent, in view of solubility for the photosensitive polyimide precursor (A), a polar solvent is preferably used. Specifically, the polar solvent includes, for example, N,N-dimethylformamide, N-methyl-2-pyrrolidone, N-ethyl-2-pyrrolidone, N,N-dimethylacetamide, dimethyl sulfoxide, diethylene glycol dimethyl ether, cyclopentanone, γ-butyrolactone, α-acetyl-γ-butyrolactone, tetramethylurea, 1,3-dimethyl-2-imidazolinone, and N-cyclohexyl-2-pyrrolidone. One of these may be used alone, or two or more thereof may be used in combination.

As the solvent for use in the present invention, from the viewpoint of enhancing the storage stability of the photosensitive resin composition, a solvent containing alcohols is preferred. The alcohols that can be suitably used are an alcohol having an alcoholic hydroxyl group within the molecule and not having an olefin-based double bond.

Specific examples thereof include:
alkyl alcohols such as methyl alcohol, ethyl alcohol, n-propyl alcohol, isopropyl alcohol, n-butyl alcohol, isobutyl alcohol, and tert-butyl alcohol;
lactic acid esters such as ethyl lactate;
propylene glycol monoalkyl ethers such as propylene glycol-1-methyl ether, propylene glycol-2-methyl ether, propylene glycol-1-ethyl ether, propylene glycol- 2-ethyl ether, propylene glycol-1-(n-propyl) ether, and propylene glycol-2-(n-propyl) ether;

monoalcohols such as ethylene glycol methyl ether, ethylene glycol ethyl ether, ethylene glycol-n-propyl ether;

2-hydroxyisobutyric acid esters; and dialcohols such as ethylene glycol and propylene glycol.

Among these, lactic acid esters, propylene glycol monoalkyl ethers, 2-hydroxyisobutyric acid esters, and ethyl alcohol are preferred, and ethyl lactate, propylene glycol-1-methyl ether, propylene glycol-1-ethyl ether, and propylene glycol-1-(n-propyl) ether are more preferred.

The solvent can be used in the range of, for example, from 30 to 1,500 parts by mass, preferably from 100 to 1,000 parts by mass, per 100 parts by mass of the photosensitive polyimide precursor (A) according to the desired coating film thickness and viscosity of the photosensitive resin composition. In the case where the solvent contains an alcohol not having an olefin-based double bond, the content of the alcohol not having an olefin-based double bond is preferably from 5 to 50 mass %, more preferably from 10 to 30 mass %, relative to all solvents. When the content of the alcohol not having an olefin-based double bond is 5 mass % or more, the storage stability of the photosensitive resin composition is improved. When the content of the alcohol not having an olefin-based double bond is 50 mass- or less, the solubility of the photosensitive polyimide precursor (A) is improved.

The photosensitive resin composition of the present invention may further contain a resin component other than the photosensitive polyimide precursor (A). The resin component that can be contained includes, for example, a polyimide, a polyoxazole, a polyoxazole precursor, a phenol resin, a polyamide, an epoxy resin, a siloxane resin, and an acrylic resin. The blending amount of this resin component is preferably from 0.01 to 20 parts by mass per 100 parts by mass of the photosensitive polyimide precursor (A).

In the photosensitive resin composition of the present invention, a sensitizer may be optionally blended for enhancing the optical sensitivity. The sensitizer includes, for example, Michler's ketone, 4,4'-bis(diethylamino)benzophenone, 2,5-bis(4'-diethylaminobenzal)cyclopentane, 2,6-bis(4'-diethylaminobenzal)cyclohexanone, 2,6-bis(4'-diethylaminobenzal)-4-methylcyclohexanone, 4,4'-bis(dimethylamino)chalcone, 4,4'-bis(diethylamino)chalcone, p-dimethylaminocinnamylideneindanone, p-dimethylaminobenzylideneindanone, 2-(p-dimethylaminophenylbiphenylene)-benzothiazole, 2-(p-dimethylaminophenylvinylene)benzothiazole, 2-(p-dimethylaminophenylvinylene)isonaphthothiazole, 1,3-bis(4'-dimethylaminobenzal)acetone, 1,3-bis(4'-diethylaminobenzal)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N'-ethylethanolamine, N-phenyldiethanolamine, N-p-tolyldiethanolamine, N-phenylethanolamine, 4-morpholinobenzophenone, isoamyl dimethylaminobenzoate, isoamyl diethylaminobenzoate, 2-mercaptobenzimidazole, 1-phenyl-5-mercaptotetrazole, 2-mercaptobenzothiazole, 2-(p-dimethylaminophenyl)benzoxazole, 2-(p-dimethylaminostyryl)benzothiazole, 2-(p-dimethylaminostyryl)naphtho(1,2-d)thiazole, 2-(p-dimethylaminobenzoyl)styrene, diphenylacetamide, benzanilide, N-methylacetanilide, and 3',4'-dimethylacetanilide. One of these may be used alone, or from two to five thereof may be used in combination.

In the case where the photosensitive resin composition contains a sensitizer for enhancing the optical sensitivity, the blending amount thereof is preferably from 0.1 to 25 parts by mass per 100 parts by mass of the photosensitive polyimide precursor (A).

In the photosensitive resin composition of the present invention, a monomer having a photopolymerizable unsaturated bond may be optionally blended for enhancing the resolution of a relief pattern. Such a monomer is preferably a (meth)acrylic compound undergoing a radical polymerization reaction under action of a photopolymerization initiator.

The (meth)acrylic compound includes, but is not limited to, particularly compounds such as:

mono- or di-(meth)acrylate of ethylene glycol or polyethylene glycol, including diethylene glycol dimethacrylate and tetraethylene glycol dimethacrylate;

mono- or di-(meth)acrylate of propylene glycol or polypropylene glycol;

mono-, di- or tri-(meth)acrylate of glycerol;

cyclohexane di(meth)acrylate;

diacrylate and dimethacrylate of 1,4-butanediol, and di(meth)acrylate of 1,6-hexanediol;

di(meth)acrylate of neopentyl glycol;

mono- or di-(meth)acrylate of bisphenol A;

benzene trimethacrylate;

isobornyl (meth)acrylate;

acrylamide and a derivative thereof;

methacrylamide and a derivative thereof;

trimethylolpropane tri(meth)acrylate;

di- or tri-(meth)acrylate of glycerol;

di-, tri- or tetra-(meth)acrylate of pentaerythritol; and an ethylene oxide or propylene oxide adduct of these compounds.

In the case where the photosensitive resin composition of the present invention contains the monomer having a photopolymerizable unsaturated bond for enhancing the resolution of a relief pattern, the blending amount thereof is preferably from 1 to 50 parts by mass per 100 parts by mass of the photosensitive polyimide precursor (A).

In the photosensitive resin composition of the present invention, an adhesion aid may be optionally blended for enhancing the adhesiveness between a film formed from the photosensitive resin composition of the present invention and a substrate. The adhesion aid includes, for example, a silane coupling agent such as γ-aminopropyldimethoxysilane, N-(β-aminoethyl)-γ-aminopropylmethyldimethoxysilane, γ-glycidoxypropylmethyldimethoxysilane, γ-mercaptopropylmethyldimethoxysilane, 3-methacryloxypropyldimethoxymethylsilane, 3-methacryloxypropyltrimethoxysilane, dimethoxymethyl-3-piperidinopropylsilane, diethoxy-3-glycidoxypropylmethylsilane, N-(3-diethoxymethylsilylpropyl)succinimide, N-[3-(triethoxysilyl)propyl]phthalamic acid, benzophenone-3,3'-bis(N-[3-triethoxysilyl]propylamido)-4,4'-dicarboxylic acid, benzene-1,4-bis(N-[3-triethoxysilyl]propylamido)-2,5-dicarboxylic acid, 3-(triethoxysilyl)propylsuccinic anhydride and N-phenylaminopropyltrimethoxysilane; and an aluminum-based adhesion aid such as aluminum tris(ethylacetoacetate), aluminum tris(acetylacetonate) and ethylacetoacetate aluminum diisopropylate.

Among these adhesion aids, in view of adhesive force, it is more preferable to use a silane coupling agent. In the case where the photosensitive resin composition contains an adhesion aid, the blending amount thereof is preferably from 0.5 to 25 parts by mass per 100 parts by mass of the photosensitive polyimide precursor of the component (A).

In the case where the photosensitive resin composition of the present invention is particularly in a solution state containing a solvent, a thermal polymerization inhibitor may be optionally blended in the photosensitive resin composition for enhancing the stability of viscosity and optical sensitivity during storage. As the thermal polymerization inhibitor, for example, hydroquinone, N-nitrodiphenylamine, p-tert-butylcatechol, phenothiazine, N-phenylnaphthylamine, ethylenediaminetetraacetic acid, 1,2-cyclohexanediaminetetraacetic acid, glycol ether diaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxylamine ammonium salt, or N-nitroso-N-(1-naphthyl)hydroxylamine ammonium salt is used.

In the case of blending a thermal polymerization inhibitor in the photosensitive resin composition, the blending amount thereof is preferably from 0.005 to 12 parts by mass per 100 parts by mass of the photosensitive polyimide precursor (A).

For example, in the case of forming a cured film on a substrate composed of copper or a copper alloy by using the photosensitive resin composition of the present invention, a nitrogen-containing heterocyclic compound such as azole compound and purine derivative thereof may be optionally blended for suppressing discoloration on copper. The azole compound includes, for example, 1H-triazole, 5-methyl-1H-triazole, 5-ethyl-1H-triazole, 4,5-dimethyl-1H-triazole, 5-phenyl-1H-triazole, 4-tert-butyl-5-phenyl-1H-triazole, 5-hydroxyphenyl-1H-triazole, phenyltriazole, p-ethoxyphenyltriazole, 5-phenyl-1-(2-dimethylaminoethyl)triazole, 5-benzyl-1H-triazole, hydroxyphenyltriazole, 1,5-dimethyltriazole, 4,5-diethyl-1H-triazole, 1H-benzotriazole, 2-(5-methyl-2-hydroxyphenyl)benzotriazole, 2-[2-hydroxy-3,5-bis(α,α-dimethylbenzyl)phenyl]-benzotriazole, 2-(3,5-di-tert-butyl-2-hydroxyphenyl)benzotriazole, 2-(3-tert-butyl-5-methyl-2-hydroxyphenyl)-benzotriazole, 2-(3,5-di-tert-amyl-2-hydroxyphenyl)benzotriazole, 2-(2'-hydroxy-5'-tert-octylphenyl)benzotriazole, hydroxyphenylbenzotriazole, tolyltriazole, 5-methyl-1H-benzotriazole, 4-methyl-1H-benzotriazole, 4-carboxy-1H-benzotriazole, 5-carboxy-1H-benzotriazole, 5-methyl-1H-tetrazole, 5-phenyl-1H-tetrazole, 5-amino-1H-tetrazole, and 1-methyl-1H-tetrazole. Among others, the azole compound is preferably one or more members selected from tolyltriazole, 5-methyl-1H-benzotriazole and 4-methyl-1H-benzotriazole. One of these azole compounds may be used, or a mixture of two or more thereof may be used.

Specific examples of the purine derivative include purine, adenine, guanine, hypoxanthine, xanthine, theobromine, caffeine, uric acid, isoguanine, 2,6-diaminopurine, 9-methyladenine, 2-hydroxyadenine, 2-methyladenine, 1-methyladenine, N-methyladenine, N,N-dimethyladenine, 2-fluoroadenine, 9-(2-hydroxyethyl)adenine, guanine oxime, N-(2-hydroxyethyl)adenine, 8-aminoadenine, 6-amino-8-phenyl-9H-purine, 1-ethyladenine, 6-ethylaminopurine, 1-benzyladenine, N-methylguanine, 7-(2-hydroxyethyl)quinine, N-(3-chlorophenyl)guanine, N-(3-ethylphenyl)guanine, 2-azaindene, 5-azaindene, 8-azaindene, 8-azaguanine, 8-azapurine, 8-azaxanthine, 8-azahypoxanthine, and a derivative thereof.

In the case where the photosensitive resin composition contains the above-described azole compound or purine derivative, the blending amount thereof is preferably from 0.1 to 20 parts by mass per 100 parts by mass of the resin (A). In view of optical sensitivity properties, the blending amount is more preferably from 0.5 to 5 parts by mass. When the blending amount of the azole compound per 100 parts by mass of the resin (A) is 0.1 parts by mass or more, in the case of forming the photosensitive resin composition of the present invention on copper or a copper alloy, discoloration of the copper or copper alloy surface is suppressed. On the other hand, when the blending amount of the azole compound is 20 parts by mass or less, the optical sensitivity is excellent.

In order to suppress discoloration of the copper surface, a hindered phenol compound may be optionally blended in place of the azole compound or together with the azole compound. The hindered phenol compound includes, but is not limited to, for example, 2,6-di-tert-butyl-4-methylphenol, 2,5-di-tert-butyl-hydroquinone, octadecyl-3-(3,5-di-tert-butyl-4-hydroxyphenyl)propionate, isooctyl-3-(3,5-di-tert-butyl-4-hydroxyphenyl)propionate, 4,4'-methylenebis(2,6-di-tert-butylphenol), 4,4'-thio-bis(3-methyl-6-tert-butylphenol), 4,4'-butylidene-bis(3-methyl-6-tert-butylphenol), triethylene glycol-bis[3-(3-tert-butyl-5-methyl-4-hydroxyphenyl)propionate], 1,6-hexanediol-bis [3-(3,5-di-tert-butyl-4-hydroxyphenyl)propionate], 2,2-thiodiethylenebis[3-(3,5-di-tert-butyl-4-hydroxyphenyl) propionate], N,N'-hexamethylenebis(3,5-di-tert-butyl-4-hydroxy-hydrocinnamide), 2,2'-methylene-bis(4-methyl-6-tert-butylphenol), 2,2'-methylene-bis(4-ethyl-6-tert-butylphenol), pentaerythrityl-tetrakis[3-(3,5-di-tert-butyl-4-hydroxyphenyl)propionate], tris-(3,5-di-tert-butyl-4-hydroxybenzyl)-isocyanurate, 1,3,5-trimethyl-2,4,6-tris(3,5-di-tert-butyl-4-hydroxybenzyl)benzene, 1,3,5-tris(3-hydroxy-2,6-dimethyl-4-isopropylbenzyl)-1,3,5-triazine-2, 4,6-(1H,3H,5H)-trione, 1,3,5-tris(4-tert-butyl-3-hydroxy-2, 6-dimethylbenzyl)-1,3,5-triazine-2,4,6-(1H,3H,5H)-trione, 1,3,5-tris(4-s-butyl-3-hydroxy-2,6-dimethylbenzyl)-1,3,5-triazine-2,4,6-(1H,3H,5H)-trione, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2, 6-dimethylbenzyl]-1,3,5-triazine-2,4,6-(1H,3H,5H)-trione, 1,3,5-tris(3-hydroxy-2,6-dimethyl-4-phenylbenzyl)-1,3,5-triazine-2,4,6-(1H,3H,5H)-trione, 1,3,5-tris(4-tert-butyl-3-hydroxy-2,5,6-trimethylbenzyl)-1,3,5-triazine-2,4,6-(1H, 3H,5H)-trione, 1,3,5-tris(4-tert-butyl-5-ethyl-3-hydroxy-2, 6-dimethylbenzyl)-1,3,5-triazine-2,4,6-(1H,3H,5H)-trione, 1,3,5-tris(4-tert-butyl-6-ethyl-3-hydroxy-2-methylbenzyl)-1,3,5-triazine-2,4,6-(1H,3H,5H)-trione, 1,3,5-tris(4-tert-butyl-6-ethyl-3-hydroxy-2,5-dimethylbenzyl)-1,3,5-triazine-2,4,6-(1H,3H,5H)-trione, 1,3,5-tris(4-tert-butyl-5,6-diethyl-3-hydroxy-2-methylbenzyl)-1,3,5-triazine-2,4,6-(1H,3H,5H)-trione, 1,3,5-tris(4-tert-butyl-3-hydroxy-2-methylbenzyl)-1,3,5-triazine-2,4,6-(1H,3H,5H)-trione, 1,3,5-tris(4-tert-butyl-3-hydroxy-2,5-dimethylbenzyl)-1,3,5-triazine-2,4,6-(1H,3H,5H)-trione, and 1,3,5-tris(4-tert-butyl-5-ethyl-3-hydroxy-2-methylbenzyl)-1,3,5-triazine-2, 4,6-(1H,3H,5H)-trione. Among these, 1,3,5-tris(4-tert-butyl-3-hydroxy-2,6-dimethylbenzyl)-1,3,5-triazine-2,4,6-(1H,3H,5H)-trione, etc. are particularly preferred.

The blending amount of the hindered phenol compound is preferably from 0.1 to 20 parts by mass per 100 parts by mass of the photosensitive polyimide precursor (A) and in view of optical sensitivity properties, more preferably from 0.5 to 10 parts by mass. When the blending amount of the hindered phenol compound per 100 parts by mass of the photosensitive polyimide precursor (A) is 0.1 parts by mass or more, in the case of forming the photosensitive resin composition of the present invention, for example, on copper or a copper alloy, discoloration/corrosion of the copper or copper alloy are prevented. On the other hand, when the blending amount of the hindered phenol compound is 20 parts by mass or less, excellent optical sensitivity of the photosensitive resin composition is maintained.

In the photosensitive resin composition of the present invention, a crosslinking agent may be incorporated. The crosslinking agent may be a crosslinking agent capable of crosslinking the resin (A) or forming a crosslinking network by itself at the time of heating and curing a relief pattern formed using the photosensitive resin composition of the present invention. The crosslinking agent can further strengthen the heat resistance and chemical resistance of a cured film formed from the photosensitive resin composition.

The crosslinking agent includes, for example, as a compound containing a methylol group and/or an alkoxymethyl group, CYMEL (registered trademark) 300, 301, 303, 370, 325, 327, 701, 266, 267, 238, 1141, 272, 202, 1156, 1158, 1123, 1170 and 1174, UFR 65 and 300, and MYCOAT 102 and 105 (all produced by Mitsui Cytec Ltd.); NIKALAC (registered trademark) MX-270, -280 and -290, NIKALAC MS-11, and NIKALAC MW-30, -100, -300, -390 and -750 (all produced by Sanwa Chemical Co., Ltd.); DML-OCHP, DML-MBPC, DML-BPC, DML-PEP, DML-34X, DML-PSBP, DML-PTBP, DML-PCHP, DML-POP, DML-PFP, DML-MBOC, BisCMP-F, DML-BisOC-Z, DML-BisO-CHP-Z, DML-BisOC-P, DMOM-PTBT, TMOM-BP, TMOM-BPA, and TML-BPAF-MF (all produced by Honshu Chemical Industry Co., Ltd.); benzenedimethanol, bis(hydroxymethyl)cresol, bis(hydroxymethyl)dimethoxybenzene, bis(hydroxymethyl)diphenyl ether, bis(hydroxymethyl)benzophenone, hydroxymethylphenyl hydroxymethylbenzoate, bis(hydroxymethyl)biphenyl, dimethylbis(hydroxymethyl)biphenyl, bis(methoxymethyl)benzene, bis(methoxymethyl)cresol, bis(methoxymethyl)dimethoxybenzene, bis(methoxymethyl)diphenyl ether, bis(methoxymethyl)benzophenone, methoxymethylphenyl methoxymethylbenzoate, bis(methoxymethyl)biphenyl, and dimethylbis(methoxymethyl)biphenyl.

The crosslinking agent also includes, as an oxirane compound, a phenol novolak-type epoxy resin, a cresol novolak-type epoxy resin, a bisphenol-type epoxy resin, a trisphenol-type epoxy resin, a tetraphenol-type epoxy resin, a phenol-xylylene-type epoxy resin, a naphthol-xylylene-type epoxy resin, a phenol-naphthol-type epoxy resin, a phenol-dicyclopentadiene-type epoxy resin, an alicyclic epoxy resin, an aliphatic epoxy resin, diethylene glycol diglycidyl ether, sorbitol polyglycidyl ether, propylene glycol diglycidyl ether, trimethylolpropane polyglycidyl ether, 1,1,2,2-tetra(p-hydroxyphenyl)ethane tetraglycidyl ether, glycerol triglycidyl ether, ortho-sec-butylphenyl glycidyl ether, 1,6-bis(2,3-epoxypropoxy)naphthalene, diglycerol polyglycidyl ether, polyethylene glycol glycidyl ether; YDB-340, YDB-412, YDF-2001, and YDF-2004 (all trade names, produced by Nippon Steel Chemical Co., Ltd.); NC-3000-H, EPPN-501H, EOCN-1020, NC-7000L, EPPN-201L, XD-1000, and EOCN-4600 (all trade names, produced by Nippon Kayaku Co., Ltd.); Epikote (registered trademark) 1001, Epikote 1007, Epikote 1009, Epikote 5050, Epikote 5051, Epikote 10315, Epikote 180S65, Epikote 157H70, and YX-315-75 (all trade names, produced by Japan Epoxy Resins Co., Ltd.); EHPE3150, PLACCEL G402, PUE101, and PUE105 (all trade names, produced by Daicel Chemical Industries, Ltd.); EPICLON (registered trademark) 830, 850, 1050, N-680, N-690, N-695, N-770, HP-7200, HP-820, and EXA-4850-1000 (all trade names, produced by DIC Corp.); and DENACOL (registered trademark) EX-201, EX-251, EX-203, EX-313, EX-314, EX-321, EX-411, EX-511, EX-512, EX-612, EX-614, EX-614B, EX-711, EX-731, EX-810, EX-911, and EM-150 (all trade names, produced by Nagase ChemteX Corporation); and EPOLIGHT (registered trademark) 70P and EPOLIGHT 100 MF (both trade names, produced by Kyoeisha Chemical Co., Ltd.); etc.

The crosslinking agent further includes, as an isocyanate group-containing compound, 4,4'-diphenylmethane diisocyanate, tolylene diisocyanate, 1,3-phenylenebismethylene diisocyanate, dicyclohexylmethane-4,4'-diisocyanate, isophorone diisocyanate, hexamethylene diisocyanate; TAKENATE (registered trademark) 500 and 600, and COSMONATE (registered trademark) NBDI and ND (all trade names, produced by Mitsui Chemicals Inc.); DURANATE (registered trademark) 17B-60PX, TPA-B80E, MF-B60X, MF-K60X and E402-B80T (all trade names, produced by Asahi Kasei Chemicals Corporation); etc.

The crosslinking agent further includes, as a bismaleimide compound, 4,4'-diphenylmethane bismaleimide, phenylmethane maleimide, m-phenylene bismaleimide, bisphenol A diphenylether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenylether bismaleimide, 4,4'-diphenylsulfone bismaleimide, 1,3-bis(3-maleimidophenoxy)benzene, 1,3-bis(4-maleimidophenoxy)benzene; and BMI-1000, BMI-1100, BMI-2000, BMI-2300, BMI-3000, BMI-4000, BMI-5100, BMI-7000, BMI-TMH, BMI-6000, and BMI-8000 (all trade names, produced by Daiwa Kasei Kogyo Co, Ltd.); etc., however, as long as it is a compound undergoing thermal crosslinking, the present invention is not limited thereto.

In the case of using a crosslinking agent, the blending amount thereof is preferably from 0.5 to 20 parts by mass, more preferably from 2 to 10 parts by mass, per 100 parts by mass of the resin (A). When the blending amount is 0.5 parts by mass or more, good heat resistance and chemical resistance are brought out. On the other hand, when the blending amount is 20 parts by mass or less, the storage stability is excellent.

<Method for Forming Cured Relief Pattern>

The present invention also provides a method for forming a cured relief pattern.

The method for forming a cured relief pattern of the present invention is characterized, for example, by including, in order, the following steps:
(1) a coating step of applying the above-described photosensitive resin composition of the present invention onto a substrate to form a photosensitive resin layer on the substrate,
(2) an exposure step of exposing the photosensitive resin layer,
(3) a development step of developing the photosensitive resin layer after exposure to form a relief pattern, and
(4) a heating step of heat-treating the relief pattern to form a cured relief pattern.

Typical embodiments of each step are described below.
(1) Coating Step

In this step, the photosensitive resin composition of the present invention is applied onto a substrate and, if desired, then dried to form a photosensitive resin layer.

As the substrate, for example, a metal substrate composed of silicon, aluminum, copper, a copper alloy, etc.;
a resin substrate of epoxy, polyimide, polybenzoxazole, etc.;
a substrate obtained by forming a metal circuit on the resin substrate; and a substrate in which a plurality of metals or a metal and a resin are stacked in multiple layers; can be used.

In the present invention, among others, a substrate in which at least the surface of the substrate is composed of Cu, is preferably used, because the effect of the present invention of suppressing generation of a void at the interface of a Cu layer and a polyimide layer can be obtained. However, the present invention is applicable also to other substrates.

As the coating method, a method conventionally employed for applying a photosensitive resin composition can be used. For example, a method of applying the composition by a spin coater, a bar coater, a blade coater, a curtain coater, a screen printer, etc., or a method of spraying/applying the composition by a spray coater, can be used.

If desired, the photosensitive resin composition film can be dried. As the drying method, a method such as air drying, drying by heating with an oven or a hot plate and vacuum drying is used. The drying of the coating film is preferably performed under the conditions not allowing for occurrence of imidation of the photosensitive polyimide precursor (A) (polyamic acid ester) in the photosensitive resin composition. Specifically, in the case of performing air drying or drying by heating, the drying may be performed under the conditions of from 20 to 140° C. and from 1 minute to 1 hour. In this way, a photosensitive resin layer can be formed on a substrate.

(2) Exposure Step

In this step, the photosensitive resin layer formed above is exposed. As the exposure apparatus, for example, an exposure apparatus such as contact aligner, mirror projection and a stepper is used. The exposure may be performed directly or through a photomask or reticule having a pattern. The light source used for exposure is, for example, an ultraviolet light source.

After the exposure, post-exposure baking (PEB) and/or pre-development baking by an arbitrary combination of temperature and time may be applied, if desired, with the purpose of, for example, enhancing the optical sensitivity. The baking conditions are preferably a temperature of 40 to 120° C. and a time of 10 to 240 seconds. However, as long as various properties of the photosensitive resin composition of the present invention are not impaired, the conditions are not limited to these ranges.

(3) Development Step

In this step, the unexposed area out of the photosensitive resin layer after exposure is removed by development. As the development method of developing the photosensitive resin layer after exposure (irradiation), a conventionally known method for developing a photoresist may be selected and used. The method is, for example, a rotary spray method, a puddle method, or a dipping method combined with ultrasonic wave treatment. After the development, for the purpose of, for example, adjusting the profile of the relief pattern, post-development baking by an arbitrary combination of temperature and time may be applied, if desired. The temperature of the post-development baking may be, for example, from 80 to 130° C. The post-development baking time may be, for example, from 0.5 to 10 minutes.

The developer used for development is preferably a good solvent for the photosensitive resin composition or a combination of the good solvent and a poor solvent. As the good solvent, N-methyl-2-pyrrolidone, N-cyclohexyl-2-pyrrolidone, N,N-dimethylacetamide, cyclopentanone, cyclohexanone, γ-butyrolactone, α-acetyl-γ-butyrolactone, etc. are preferred. As the poor solvent, toluene, xylene, methanol, ethanol, isopropyl alcohol, ethyl lactate, propylene glycol methyl ether acetate, water, etc. are preferred. In the case of using a good solvent and a poor solvent by mixing these solvents, the ratio of the poor solvent relative to the good solvent is preferably adjusted according to the solubility of the polymer in the photosensitive resin composition. As for each solvent, two or more solvents, for example, a plurality of kinds of solvents, may also be used in combination.

(4) Heating Step

In this step, the relief pattern obtained by the development above is heated to volatilize the photosensitive component and at the same time, imidize the photosensitive polyimide precursor (A) and is thereby converted to a cured relief pattern composed of a polyimide.

As the heating/curing method, various methods, for example, those using a hot plate, an oven or a temperature-programmed oven capable of setting a temperature program, may be selected. The heating can be performed, for example, under the conditions of from 200 to 400° C. and from 30 minutes to 5 hours. As the atmosphere gas at the time of heating/curing, air may be used, or an inert gas such as nitrogen and argon may be used.

In this way, a cured relief pattern can be produced.

<Semiconductor Device>

The semiconductor device of this embodiment is a semiconductor device including copper wiring and an insulating layer provided on the copper wiring, wherein:

after storage in air with a humidity of 5% for 168 hours under the condition of 150° C., the area of empty void (void) portion of the copper wiring is 10% or less at the copper wiring surface in contact with the insulating layer. As the area of void portion is smaller, short-circuiting or disconnection following a high-temperature storage test is advantageously hard to occur.

The area of void portion is preferably 9% or less, more preferably 8% or less, still more preferably 7% or less, yet still more preferably 6% or less, even yet still more preferably 5% or less, more preferably 4% or less, still more preferably 3% or less, yet still more preferably 2% or less, even yet still more preferably 1% or less.

The method for measuring the area of void portion includes the measurement method described in Examples later. The void formed due to migration of a copper component of the copper wiring layer into the insulating layer is expected to be in vacuum or filled with a gas such as air.

The semiconductor device above may be a semiconductor device including, for example, a base material that is a semiconductor element, and a cured relief pattern formed on the base material by the above-described cured relief pattern-forming method.

That is, the semiconductor device of the present invention has a base material and a cured relief pattern formed on the base material. The cured relief pattern is characterized by containing a polyimide resin and the above-described compound represented by formula (B1). The semiconductor device can be manufactured by a method using a semiconductor element as the base material and including the above-described cured relief pattern-forming method as part of the process. More specifically, a cured relief pattern formed by the above-described cured relief pattern-forming method is formed, for example, as a surface protective film, an interlayer insulating film, an insulating film for rewiring, a protective film for a flip-chip device, or a protective film of a semiconductor device having a bump structure. The semiconductor device of the present invention can be manufactured by combining this cured relief pattern-forming method with a known method for manufacturing a semiconductor device.

When the semiconductor device of the present invention is applied to a relief pattern including a metal rewiring layer composed of a Cu layer and a polyimide resin, generation of a void at the interface is suppressed to provide high adhesion and excellent properties.

In addition to the application to the above-described semiconductor device, the photosensitive resin composition of the present invention is also useful for uses such as an interlayer insulation of multilayer circuit, a cover coat of flexible copper clad laminate, a solder resist film and a liquid crystal alignment film.

EXAMPLES

The present invention is more specifically described below by referring to Examples, but the present invention is not limited thereto. The physical properties of the photosensitive resin composition in Examples, Comparative Examples and Production Examples were measured and evaluated according to the following methods.

(1) Weight Average Molecular Weight

The weight average molecular weight (Mw) of each polyamic acid ester prepared by the later-described method was measured in terms of standard polystyrene by using gel permeation chromatography (GPC). The analysis conditions of GPC are as follows:

Column: trademark Shodex 805M/806M in series, manufactured by Showa Denko K.K.

Standard monodisperse polystyrene: Shodex STANDARD SM-105, produced by Showa Denko K.K.

Eluent: N-methyl-2-pyrrolidone, 40° C.

Flow velocity: 1.0 ml/min

Detector: trademark Shodex RI-930, manufactured by Showa Denko K.K.

(2) Formation of Cured Relief Pattern on Cu

On a 6-inch silicon wafer (manufactured by Fujimi Incorporated, thickness: 625±25 μm), 200 nm-thick Ti and 400 nm-thick Cu were sputtered in this order by using a sputtering apparatus (Model L-440S-FHL, manufactured by Canon Anelva Corporation). Subsequently, a photosensitive polyamic acid ester composition prepared by the later-described method was rotationally applied onto the wafer above by means of a coater/developer (Model D-Spin 60A, manufactured by SOKUDO) and dried to form a 10 μm-thick coating film. This coating film was irradiated with an energy of 300 mJ/cm$^2$ by means of a parallel light mask aligner (Model PLA-501FA, manufactured by Canon Inc.). Thereafter, the coating film was subjected to spray development by means of a coater/developer (Model D-Spin 60A, manufactured by SOKUDO) by using cyclopentanone as the developer and rinsed with propylene glycol methyl ether acetate to obtain a relief pattern on Cu.

The wafer after forming the relief pattern on Cu was heat-treated for 2 hours at the temperature described in each Example in a nitrogen atmosphere by using a temperature-programmed curing furnace (Model VF-2000, manufactured by Koyo Lindbergh Co., Ltd.). In this way, a cured relief pattern composed of polyimide resin having a thickness of approximately from 6 to 7 μm was obtained on Cu.

(3) High-Temperature Storage Test of Cured Relief Pattern on Cu and Evaluation Thereafter The wafer after forming the cured relief pattern on Cu was heated at 150° C. for 168 hours in air with a humidity of 5% by using a temperature-programmed curing furnace (Model VF-2000, manufactured by Koyo Lindbergh Co., Ltd.). Subsequently, the polyimide resin layer on Cu was removed by plasma etching by using a plasma surface treatment apparatus (Model EXAM, manufactured by Shinko Seiki Co., Ltd.). The plasma etching conditions are as follows.

Output: 133 W

Gas species·flow rate: $O_2$: 40 ml/min+$CF_4$: 1 ml/min

Gas pressure: 50 Pa

Mode: Hard mode

Etching time: 1,800 seconds

The Cu surface after the polyimide resin layer was entirely removed was observed at a magnification of 1,000 times from directly above by means of FE-SEM (Model S-4800, manufactured by Hitachi High-Technologies Corporation), and with respect to an area of 126 μm×87 μm, a photograph was taken with a number of pixels of 1,280×960. With respect to the photograph taken here, the ratio of area of voids in the surface of Cu layer was calculated using an image analysis software (A-Zo Kun, produced by Asahi Kasei Corporation). More specifically, a portion that is a void, and a portion that is not a void, were separated based on the contrast of the SEM image. The ratio of area of voids when viewed from above of the Cu surface was calculated by dividing the number of pixels in the void portion by the number of pixels of the entire photograph.

Production Example 1

(Synthesis of (A) Photosensitive Polyimide Precursor (Polymer A-1))

155.1 g of 4,4'-oxydiphthalic acid dianhydride (ODPA) was put into a 2 liter-volume separable flask, and 134.0 g of 2-hydroxyethyl methacrylate (HEMA) and 400 ml of γ-butyrolactone were added. While stirring at room temperature, 79.1 g of pyridine was added to obtain a reaction mixture. After the completion of heat generation by the reaction, the reaction mixture was allowed to cool to room temperature and further left standing for 16 hours.

Thereafter, a solution prepared by dissolving 206.3 g of dicyclohexylcarbodiimide (DCC) in 180 ml of γ-butyrolactone was added to the reaction mixture with stirring over 40 minutes under cooling with ice. Subsequently, a suspension prepared by suspending 93.0 g of 4,4'-diaminodiphenyl ether (DADPE) in 350 ml of γ-butyrolactone was added over 60 minutes with stirring. After stirring at room temperature for 2 hours, 30 ml of ethyl alcohol was added, followed by stirring for 1 hour, and 400 ml of γ-butyrolactone was then added. A precipitate produced in the reaction mixture was removed by filtration to obtain a reaction solution.

The obtained reaction solution was added to 3 liter of ethyl alcohol to produce a precipitate composed of a crude polymer. The produced crude polymer was collected by filtration and dissolved in 1.5 liter of tetrahydrofuran to obtain a crude polymer solution. The obtained crude polymer solution was added dropwise to 28 liter of water to precipitate a polymer and the obtained precipitate was collected by filtration and then vacuum-dried to obtain Polymer A-1 as a powder.

The weight average molecular weight (Mw) of Polymer A-1 was measured and found to be 20,000.

Production Example 2

(Synthesis of (A) Photosensitive Polyimide Precursor (Polymer A-2))

Polymer A-2 was obtained by performing reactions in the same manner as in the method described in Production Example 1 except that in Production Example 1, 147.1 g of 3,3'4,4'-biphenyltetracarboxylic acid dianhydride was used in place of 155.1 g of 4,4'-oxydiphthalic acid dianhydride.

The weight average molecular weight (Mw) of Polymer A-2 was measured and found to be 22,000.

Production Example 3

(Synthesis of (A) Photosensitive Polyimide Precursor (Polymer A-3))

Polymer A-3 was obtained by performing reactions in the same manner as in the method described in Production Example 1 except that in Production Example 1, 94.1 g of 2,2'-dimethyl-4,4'-diaminobiphenyl was used in place of 93.0 g of 4,4'-diaminodiphenyl ether (DADPE).

The molecular weight of Polymer A-3 was measured by gel permeation chromatography (in terms of standard polystyrene), as a result, the weight average molecular weight (Mw) was 21,000.

Example 1

100 g of Polymer A-3 as the component (A), 2 g of B-2 as the component (B), 8 g of tetraethylene glycol dimethacrylate as the component (C), 0.05 g of 2-nitroso-1-naphthol, 4 g of N-phenyldiethanolamine, 0.5 g of N-(3-(triethoxysilyl)propyl)phthalamic acid, and 0.5 g of benzophenone-3,3'-bis(N-(3-triethoxylyl)propylamide)-4,4'-dicarboxylic acid were dissolved in a mixed solvent composed of N-methylpyrrolidone and ethyl acetate (weight ratio: 8:2), and the amount of the solvent was adjusted to give a viscosity of about 35 poise and thereby prepare a photosensitive resin composition solution.

With respect to this composition, a cured relief pattern was formed on the Cu layer through curing at 200° C. by the above-described method. After performing the high-temperature storage test, the ratio of area of voids in the surface of the Cu layer was evaluated. The ratio of area of voids was 81.

Example 2

A photosensitive resin composition solution was prepared in the same manner as in Example 1 except that in Example 1, B-2 as the component (B) was changed to B-3.

With respect to this composition, a cured relief pattern was formed by the above-described method. The ratio of area of voids in the surface of the Cu layer after the high-temperature storage test was evaluated. The ratio of area of voids was 4%.

Example 3

A photosensitive resin composition solution was prepared in the same manner as in Example 1 except that in Example 1, B-2 as the component (B) was changed to B-4.

With respect to this composition, a cured relief pattern was formed by the above-described method. The ratio of area of voids in the surface of the Cu layer after the high-temperature storage test was evaluated. The ratio of area of voids was 4s.

Example 4

A photosensitive resin composition solution was prepared in the same manner as in Example 1 except that in Example 1, B-2 as the component (B) was changed to B-5.

With respect to this composition, a cured relief pattern was formed by the above-described method. The ratio of area of voids in the surface of the Cu layer after the high-temperature storage test was evaluated. The ratio of area of voids was 61.

Example 5

A photosensitive resin composition solution was prepared in the same manner as in Example 1 except that in Example 1, Polymer A-3 as the component (A) was changed to Polymer A-1.

With respect to this composition, a cured relief pattern was formed by the above-described method. The ratio of area of voids in the surface of the Cu layer after the high-temperature storage test was evaluated. The ratio of area of voids was 5s.

Example 6

A cured relief pattern was formed on Cu in the same manner as in Example 1 except that in Example 1, Polymer A-3 as the component (A) was changed to Polymer A-1 and B-2 as the component (B) was changed to B-3.

With respect to this cured relief pattern on Cu, a cured relief pattern was formed by the above-described method. The ratio of area of voids in the surface of the Cu layer after the high-temperature storage test was evaluated. The ratio of area of voids was 2%.

Example 7

A photosensitive resin composition solution was prepared in the same manner as in Example 1 except that in Example 1, Polymer A-3 as the component (A) was changed to Polymer A-1 and B-2 as the component (B) was changed to B-4.

With respect to this composition, a cured relief pattern was formed by the above-described method. The ratio of area of voids in the surface of the Cu layer after the high-temperature storage test was evaluated. The ratio of area of voids was 2%.

Example 8

A photosensitive resin composition solution was prepared in the same manner as in Example 1 except that in Example 1, Polymer A-3 as the component (A) was changed to A-1 and B-2 as the component (B) was changed to B-5.

With respect to this composition, a cured relief pattern was formed by the above-described method. The ratio of area of voids in the surface of the Cu layer after the high-temperature storage test was evaluated. The ratio of area of voids was 4%.

Example 9

A photosensitive resin composition solution was prepared in the same manner as in Example 1 except that in Example 1, 100 g of Polymer A-3 as the component (A) was changed to 50 g of Polymer A-1 and 50 g of Polymer A-2.

With respect to this composition, a cured relief pattern was formed by the above-described method. The ratio of area of voids in the surface of the Cu layer after the high-temperature storage test was evaluated. The ratio of area of voids was 3%.

Example 10

A photosensitive resin composition solution was prepared in the same manner as in Example 1 except that in Example 1, 100 g of Polymer A-3 as the component (A) was changed to 50 g of Polymer A-1 and 50 g of Polymer A-2 and B-2 as the component (B) was changed to B-3.

With respect to this composition, a cured relief pattern was formed by the above-described method. The ratio of area of voids in the surface of the Cu layer after the high-temperature storage test was evaluated. The ratio of area of voids was 1%.

Example 11

A photosensitive resin composition solution was prepared in the same manner as in Example 1 except that in Example 1, 100 g of Polymer A-3 as the component (A) was changed to 50 g of Polymer A-1 and 50 g of Polymer A-2 and B-2 as the component (B) was changed to B-4.

With respect to this composition, a cured relief pattern was formed by the above-described method. The ratio of area of voids in the surface of the Cu layer after the high-temperature storage test was evaluated. The ratio of area of voids was 1%.

Example 12

A photosensitive resin composition solution was prepared in the same manner as in Example 1 except that in Example 1, 100 g of Polymer A-3 as the component (A) was changed to 50 g of Polymer A-1 and 50 g of Polymer A-2 and B-2 as the component (B) was changed to B-5.

With respect to this composition, a cured relief pattern was formed by the above-described method. The ratio of area of voids in the surface of the Cu layer after the high-temperature storage test was evaluated. The ratio of area of voids was 2%.

Comparative Example 1

A photosensitive resin composition solution was prepared in the same manner as in Example 1 except that in Example 1, B-2 as the component (B) was changed to b-1.

With respect to this composition, a cured relief pattern was formed by the above-described method. The ratio of area of voids in the surface of the Cu layer after the high-temperature storage test was evaluated. The ratio of area of voids was 13%.

Comparative Example 2

A photosensitive resin composition solution was prepared in the same manner as in Example 1 except that in Example 1, Polymer A-3 as the component (A) was changed to Polymer A-1 and B-2 as the component (B) was changed to b-1.

With respect to this composition, a cured relief pattern was formed by the above-described method. The ratio of area of voids in the surface of the Cu layer after the high-temperature storage test was evaluated. The ratio of area of voids was 12%.

Comparative Example 3

A photosensitive resin composition solution was prepared in the same manner as in Example 1 except that in Example 1, 100 g of Polymer A-3 as the component (A) was changed to 50 g of Polymer A-1 and 50 g of Polymer A-2 and B-2 as the component (B) was changed to b-1.

With respect to this composition, a cured relief pattern was formed by the above-described method. The ratio of area of voids in the surface of the Cu layer after the high-temperature storage test was evaluated. The ratio of area of voids was 125.

The evaluation results of the ratio of area of voids in the Cu layer with respect to the photosensitive resin compositions of Examples 1 to 12 and Comparative Examples 1 to 3 are shown in Table 1.

TABLE 1

| | Component (A) | Component (B) | Alternate Component | Ratio of Area of Voids, % |
|---|---|---|---|---|
| Example 1 | Polymer A-3 | B-2 | | 8 |
| Example 2 | Polymer A-3 | B-3 | | 4 |
| Example 3 | Polymer A-3 | B-4 | | 4 |
| Example 4 | Polymer A-3 | B-5 | | 6 |
| Example 5 | Polymer A-1 | B-2 | | 5 |
| Example 6 | Polymer A-1 | B-3 | | 2 |
| Example 7 | Polymer A-1 | B-4 | | 2 |
| Example 8 | Polymer A-1 | B-5 | | 4 |
| Example 9 | Polymer A-1/Polymer A-2 | B-2 | | 3 |
| Example 10 | Polymer A-1/Polymer A-2 | B-3 | | 1 |
| Example 11 | Polymer A-1/Polymer A-2 | B-4 | | 1 |
| Example 12 | Polymer A-1/Polymer A-2 | B-5 | | 2 |
| Comparative Example 1 | Polymer A-3 | | b-1 | 13 |
| Comparative Example 2 | Polymer A-1 | | b-1 | 12 |
| Comparative Example 3 | Polymer A-1/Polymer A-2 | | b-1 | 12 |

Description of abbreviations in Table 1:

Component (B):

B-2

[Chem. 36]

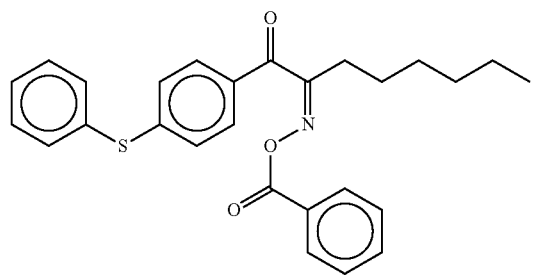

B-3

[Chem. 37]

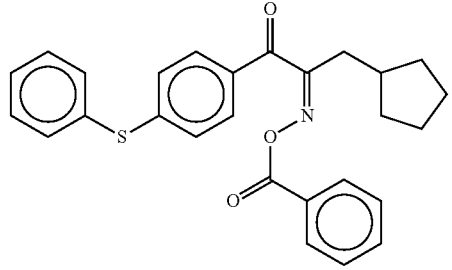

B-4

-continued

[Chem. 38]

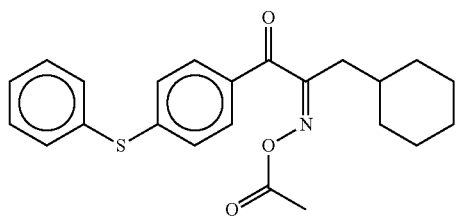

B-5

[Chem. 39]

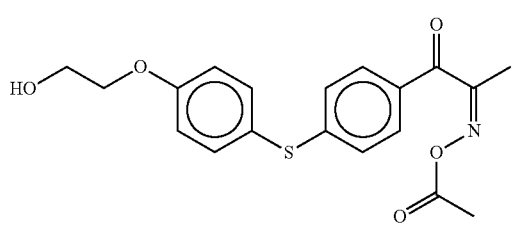

b-1

(B5)

[Chem. 40]

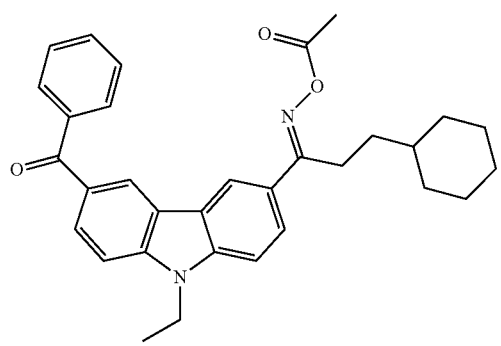

As apparent from Table 1, in the photosensitive resin compositions of Examples 1 to 12 where the component (A) as a photosensitive polyimide precursor and the component (B) represented by formula (B1) are used, generation of a void at the interface of the Cu layer in contact with the polyimide layer after the high-temperature storage test was greatly suppressed, compared with Comparative Example using Compound (b-1) in place of the component (B).

These results confirmed that when the photosensitive resin composition of the present invention, generation of a void at the interface of the Cu layer in contact with the polyimide layer is suppressed even after the high-temperature storage test. When the present invention is applied, for example, to a semiconductor device, high adhesion between the Cu layer (metal rewiring layer) and the polyimide layer (relief pattern) is achieved and excellent properties are provided.

Among others, it is understood that when the component A represented by formula (A1) has a specific structure, generation of a void is more reliably suppressed.

In the foregoing pages, the embodiments of the present invention are described, but the present invention is not limited thereto, and appropriate changes can be made therein without departing from the gist of the invention.

INDUSTRIAL APPLICABILITY

By using the photosensitive resin composition of the present invention, high adhesion due to no generation of a void at the interface of a Cu layer in contact with a polyimide layer is achieved even after a high-temperature storage test, and the photosensitive resin composition can be suitably used in the field of photosensitive materials useful for the production of, for example, an electric-electronic material of a semiconductor device, a multilayer circuit board, etc.

The invention claimed is:

1. A semiconductor device comprising copper wiring and an insulating layer provided on the copper wiring, wherein:
   after storage in air with a humidity of 5% for 168 hours at 150° C., the area of void portion of the copper wiring is 10% or less at the copper wiring surface in contact with the insulating layer,
   the insulating layer contains a cured product of a composition comprising a photosensitive polyimide precursor and an oxime ester, the cured product comprising:
      polyimide having a structure derived from 4,4'-oxydiphthalic acid dianhydride and a structure derived from 4,4'-diaminodiphenyl ether; and
      polyimide having a structure derived from 3,3'4,4'-biphenyltetracarboxylic acid dianhydride and a structure derived from 4,4'-diaminodiphenyl ether.

2. The semiconductor device according to claim 1, wherein the area of void portion is 6% or less.

3. The semiconductor device according to claim 1, wherein the area of void portion is vacuum.

4. The semiconductor device according to claim 1, wherein the area of void portion is filled with a gas.

5. The semiconductor device according to claim 1, wherein the insulating layer is an interlayer insulating film of the semiconductor device.

6. A method for preparing a semiconductor device, comprising:
   forming a copper wiring, and
   providing an insulating layer on the copper wiring,
   the method for preparing the semiconductor device further comprises curing a composition comprising a photosensitive polyimide precursor and an oxime ester to form the insulating layer,
   wherein:
   the cured composition comprises:
      polyimide having a structure derived from 4,4'-oxydiphthalic acid dianhydride and a structure derived from 4,4'-diaminodiphenyl ether; and
      polyimide having a structure derived from 3,3'4,4'-biphenyltetracarboxylic acid dianhydride and a structure derived from 4,4'-diaminodiphenyl ether,
   and
   after storage in air with a humidity of 5% for 168 hours at 150° C., the area of void portion of the copper wiring is 10% or less at the copper wiring surface in contact with the insulating layer.

7. The method according to claim 6, wherein the photosensitive polyimide precursor comprises:
   photosensitive polyimide precursor having a structure derived from 4,4'-oxydiphthalic acid dianhydride and a structure derived from 4,4'-diaminodiphenyl ether; and
   photosensitive polyimide precursor having a structure derived from 3,3'4,4'-biphenyltetracarboxylic acid dianhydride and a structure derived from 4,4'-diaminodiphenyl ether.

8. The method according to claim 6, further comprising:
   exposing the photosensitive polyimide precursor;
   developing the photosensitive polyimide precursor after exposure to form a relief pattern; and heat-treating the relief pattern to form a cured relief pattern as the insulating layer, wherein the photosensitive polyimide precursor comprises:

photosensitive polyimide precursor having a structure derived from 4,4'-oxydiphthalic acid dianhydride and a structure derived from 4,4'-diaminodiphenyl ether; and photosensitive polyimide precursor having a structure derived from 3,3'4,4'-biphenyltetracarboxylic acid dianhydride and a structure derived from 4,4'-diaminodiphenyl ether.

* * * * *